(12) United States Patent
Seery et al.

(10) Patent No.: US 10,985,688 B2
(45) Date of Patent: Apr. 20, 2021

(54) SIDELAP INTERCONNECT FOR PHOTOVOLTAIC ROOFING MODULES

(71) Applicant: Tesla, Inc., Palo Alto, CA (US)

(72) Inventors: Martin Seery, San Rafael, CA (US); David Molina, Oakland, CA (US); Trevor B. Guthrie, Santa Rosa, CA (US); Thomas Anderson, Oakland, CA (US); Jonathan Hewlett, Mill Valley, CA (US)

(73) Assignee: Tesla, Inc., Palo Alto, CA (US)

( * ) Notice: Subject to any disclaimer, the term of this patent is extended or adjusted under 35 U.S.C. 154(b) by 314 days.

(21) Appl. No.: 15/686,064

(22) Filed: Aug. 24, 2017

(65) Prior Publication Data

US 2018/0351501 A1     Dec. 6, 2018

Related U.S. Application Data

(60) Provisional application No. 62/515,434, filed on Jun. 5, 2017.

(51) Int. Cl.
*H02S 20/25* (2014.01)
*E04D 1/12* (2006.01)
(Continued)

(52) U.S. Cl.
CPC .............. *H02S 20/25* (2014.12); *E04B 1/62* (2013.01); *E04D 1/12* (2013.01); *E04D 1/2984* (2019.08);
(Continued)

(58) Field of Classification Search
CPC .... H02S 20/22–26; H02S 20/25; H02S 20/23; H02S 40/36; H02S 40/34;
(Continued)

(56) References Cited

U.S. PATENT DOCUMENTS

| 352,424 A | 11/1886 | Owen et al. |
| 3,076,861 A | 2/1963 | Samulon et al. |
| (Continued) | | |

FOREIGN PATENT DOCUMENTS

| CN | 102544380 B | 8/2015 |
| CN | 103426957 B | 3/2016 |
| (Continued) | | |

OTHER PUBLICATIONS

International Patent Application No. PCT/US2018/035918, "Invitation to Pay Additional Fees and Partial Search Report", dated Sep. 12, 2018, 11 pages.
(Continued)

*Primary Examiner* — Eli S Mekhlin
*Assistant Examiner* — Dujuan A Horton
(74) *Attorney, Agent, or Firm* — Dentons US LLP

(57) ABSTRACT

This disclosure describes methods and apparatus for assembly a roofing structure that incorporates photovoltaic modules as shingles of the roofing structure. A sidelap is used to both establish consistent spacing between the solar shingles and prevent water passing between adjacent shingles from collecting beneath the solar shingles by guiding the water passing through the solar shingles and redirecting the water down-roof. In some embodiments, the sidelaps can have additional functionality. For example, a sidelap can include tabs configured to interact with lateral securing features positioned on downward-facing surfaces of the solar roofing modules to help keep the lateral sides of the photovoltaic modules from pulling away from the roofing structure during severe weather conditions. The sidelap could also include means for attaching a wire clip to one end of the sidelap.

16 Claims, 21 Drawing Sheets

(51) Int. Cl.
| | |
|---|---|
| *E04D 1/30* | (2006.01) |
| *H01L 31/048* | (2014.01) |
| *E04B 1/62* | (2006.01) |
| *F24S 25/613* | (2018.01) |
| *H01L 31/02* | (2006.01) |
| *H02S 20/23* | (2014.01) |
| *H02S 40/36* | (2014.01) |
| *H01L 31/05* | (2014.01) |
| *E04D 1/36* | (2006.01) |
| *H02S 40/34* | (2014.01) |
| *H02S 40/32* | (2014.01) |
| *E04D 1/00* | (2006.01) |
| *H02S 30/10* | (2014.01) |
| *F24S 20/00* | (2018.01) |
| *F24S 25/60* | (2018.01) |

(52) U.S. Cl.
CPC .............. *E04D 1/30* (2013.01); *E04D 1/365* (2013.01); *F24S 25/613* (2018.05); *H01L 31/02021* (2013.01); *H01L 31/048* (2013.01); *H01L 31/0508* (2013.01); *H02S 20/23* (2014.12); *H02S 30/10* (2014.12); *H02S 40/32* (2014.12); *H02S 40/34* (2014.12); *H02S 40/36* (2014.12); *F24S 2020/13* (2018.05); *F24S 2025/6002* (2018.05)

(58) Field of Classification Search
CPC ....... H02S 40/32; H02S 30/10; E04D 1/2984; E04D 1/365; E04D 1/12; E04D 1/30; F24S 25/613; F24S 2020/13; H01L 31/02021; H01L 31/0508; H01L 31/048; Y02B 10/20; Y02B 10/10; Y02E 10/50; Y02E 10/47; Y02A 30/60
See application file for complete search history.

(56) References Cited

U.S. PATENT DOCUMENTS

| | | |
|---|---|---|
| 3,369,939 A | 2/1968 | Myer |
| 3,459,391 A | 8/1969 | Haynos |
| 3,461,602 A | 8/1969 | Hasel et al. |
| 4,040,867 A | 8/1977 | Forestieri et al. |
| 4,239,810 A | 12/1980 | Alameddine et al. |
| 4,336,413 A | 6/1982 | Tourneux |
| 4,400,577 A | 8/1983 | Spear |
| 4,623,753 A | 11/1986 | Feldman et al. |
| 4,724,011 A | 2/1988 | Turner et al. |
| 4,946,512 A | 8/1990 | Fukuroi et al. |
| 5,112,408 A | 5/1992 | Melchior |
| 5,118,540 A | 6/1992 | Hutchison |
| 5,316,592 A | 5/1994 | Dinwoodie |
| 5,338,369 A | 8/1994 | Rawlings |
| 5,427,961 A | 6/1995 | Takenouchi et al. |
| 5,482,569 A | 1/1996 | Ihara et al. |
| 5,571,338 A | 11/1996 | Kadonome et al. |
| 5,575,861 A | 11/1996 | Younan et al. |
| 5,590,495 A | 1/1997 | Bressler et al. |
| 5,596,981 A | 1/1997 | Soucy |
| 5,667,596 A | 9/1997 | Tsuzuki et al. |
| 5,919,316 A | 7/1999 | Bogorad et al. |
| 5,942,048 A | 8/1999 | Fujisaki et al. |
| 6,093,884 A | 7/2000 | Toyomura et al. |
| 6,133,522 A | 10/2000 | Kataoka et al. |
| 6,186,698 B1 | 2/2001 | Knapp |
| 6,307,144 B1 | 10/2001 | Mimura et al. |
| 6,311,436 B1 | 11/2001 | Mimura et al. |
| 6,365,824 B1 | 4/2002 | Nakazima et al. |
| 6,465,724 B1 | 10/2002 | Garvison et al. |
| 6,472,594 B1 | 10/2002 | Ichinose et al. |
| 6,515,216 B2 | 2/2003 | Zenko et al. |
| 6,586,271 B2 | 7/2003 | Hanoka |
| 6,620,645 B2 | 9/2003 | Chandra et al. |
| 6,670,541 B2 | 12/2003 | Nagao et al. |
| 6,672,018 B2 | 1/2004 | Shingleton |
| 6,883,290 B2 | 4/2005 | Dinwoodie |
| 6,959,520 B2 | 11/2005 | Hartman |
| 6,960,716 B2 | 11/2005 | Matsumi et al. |
| 7,012,188 B2 | 3/2006 | Erling |
| 7,259,321 B2 | 8/2007 | Oswald et al. |
| 7,276,724 B2 | 10/2007 | Sheats et al. |
| 7,328,534 B2 | 2/2008 | Dinwoodie |
| 7,506,477 B2 | 3/2009 | Flaherty et al. |
| 7,534,956 B2 | 5/2009 | Kataoka et al. |
| 7,772,484 B2 | 8/2010 | Li et al. |
| 7,833,808 B2 | 11/2010 | Xu et al. |
| 7,851,700 B2 | 12/2010 | Luch |
| 7,858,874 B2 | 12/2010 | Ruskin et al. |
| 7,902,451 B2 | 3/2011 | Shimizu |
| 7,964,440 B2 | 6/2011 | Salleo et al. |
| 8,109,048 B2 | 2/2012 | West et al. |
| 8,141,306 B2 | 3/2012 | Masuda et al. |
| 8,156,697 B2 | 4/2012 | Miros et al. |
| 8,205,400 B2 | 6/2012 | Allen |
| 8,206,664 B2 | 6/2012 | Lin |
| 8,276,329 B2 | 10/2012 | Lenox |
| 8,307,606 B1 | 11/2012 | Rego et al. |
| 8,471,141 B2 | 6/2013 | Stancel et al. |
| 8,519,531 B2 | 8/2013 | Pilat et al. |
| 8,601,754 B2 | 12/2013 | Jenkins et al. |
| 8,664,030 B2 | 3/2014 | Luch |
| 8,674,377 B2 | 3/2014 | Farquhar |
| 8,697,981 B2 | 4/2014 | Adriani et al. |
| 8,701,360 B2 | 4/2014 | Ressler |
| 8,713,861 B2 | 5/2014 | Desloover |
| 8,740,642 B2 | 6/2014 | Keenihan et al. |
| 8,763,322 B2 | 7/2014 | Hamamura |
| 8,822,810 B2 | 9/2014 | Luch |
| 8,869,470 B2 | 10/2014 | Lanza |
| 8,919,075 B2 | 12/2014 | Erickson |
| 9,012,763 B2 | 4/2015 | Frolov et al. |
| 9,038,330 B2 | 5/2015 | Bellavia |
| 9,150,966 B2 | 10/2015 | Xu et al. |
| 9,206,520 B2 | 12/2015 | Barr et al. |
| 9,343,592 B2 | 5/2016 | Hunt |
| 9,356,173 B2 | 5/2016 | Okandan et al. |
| 9,362,527 B2 | 6/2016 | Takemura |
| 9,412,884 B2 | 8/2016 | Heng et al. |
| 9,412,890 B1 | 8/2016 | Meyers |
| 9,435,568 B2 | 9/2016 | Smidt et al. |
| 9,496,423 B2 | 11/2016 | Loeckenhoff et al. |
| 9,496,819 B2 | 11/2016 | Hsueh et al. |
| 9,518,391 B2 | 12/2016 | Haynes et al. |
| 9,525,092 B2 | 12/2016 | Mayer et al. |
| 9,673,750 B2 | 6/2017 | Schoop et al. |
| 9,685,579 B2 | 6/2017 | Gonzalez et al. |
| 9,825,582 B2 | 11/2017 | Fernandes et al. |
| 9,882,077 B2 | 1/2018 | Morad et al. |
| 9,899,554 B2 | 2/2018 | Yang et al. |
| 9,954,480 B2 | 4/2018 | Haynes et al. |
| 9,966,487 B2 | 5/2018 | Magnusdottir et al. |
| 10,056,522 B2 | 8/2018 | Gonzalez |
| 10,145,116 B2 | 12/2018 | Holt et al. |
| 10,151,114 B2 | 12/2018 | Stearns et al. |
| 10,177,708 B2 | 1/2019 | Cruz |
| 10,256,765 B2 | 4/2019 | Rodrigues et al. |
| 10,461,685 B2 | 10/2019 | Anderson et al. |
| 10,563,406 B2 | 2/2020 | Kalkanoglu et al. |
| 2001/0054435 A1 | 12/2001 | Nagao et al. |
| 2002/0015782 A1 | 2/2002 | Abys et al. |
| 2003/0010377 A1 | 1/2003 | Fukuda et al. |
| 2003/0180983 A1 | 9/2003 | Oswald et al. |
| 2004/0261840 A1 | 12/2004 | Schmit et al. |
| 2005/0022857 A1 | 2/2005 | Daroczi et al. |
| 2005/0039788 A1 | 2/2005 | Blieske et al. |
| 2005/0268963 A1 | 12/2005 | Jordan et al. |
| 2006/0048798 A1 | 3/2006 | Mccoy et al. |
| 2006/0086620 A1 | 4/2006 | Chase et al. |
| 2006/0102380 A1 | 5/2006 | Hu |
| 2006/0204730 A1 | 9/2006 | Nakamura et al. |
| 2007/0011898 A1 | 1/2007 | Frank et al. |
| 2008/0053511 A1 | 3/2008 | Nakamura |

(56) References Cited

U.S. PATENT DOCUMENTS

| | | |
|---|---|---|
| 2008/0135085 A1 | 6/2008 | Corrales et al. |
| 2008/0231768 A1 | 9/2008 | Okabe |
| 2008/0271773 A1 | 11/2008 | Jacobs et al. |
| 2008/0302030 A1* | 12/2008 | Stancel ............ H01L 31/02008 52/173.3 |
| 2009/0101192 A1 | 4/2009 | Kothari et al. |
| 2009/0120497 A1 | 5/2009 | Schetty, III |
| 2009/0133739 A1 | 5/2009 | Shiao et al. |
| 2009/0133740 A1 | 5/2009 | Shiao et al. |
| 2009/0233083 A1 | 9/2009 | Inoue et al. |
| 2009/0242021 A1 | 10/2009 | Petkie et al. |
| 2009/0287446 A1 | 11/2009 | Wang et al. |
| 2009/0308435 A1 | 12/2009 | Caiger |
| 2010/0000603 A1 | 1/2010 | Tsuzuki et al. |
| 2010/0006147 A1 | 1/2010 | Nakashima et al. |
| 2010/0018568 A1 | 1/2010 | Nakata |
| 2010/0116330 A1 | 5/2010 | Inoue |
| 2010/0132762 A1 | 6/2010 | Graham et al. |
| 2010/0147363 A1 | 6/2010 | Huang et al. |
| 2010/0147364 A1 | 6/2010 | Gonzalez et al. |
| 2010/0180929 A1 | 7/2010 | Raymond et al. |
| 2011/0023937 A1 | 2/2011 | Daniel et al. |
| 2011/0023942 A1 | 2/2011 | Soegding et al. |
| 2011/0030761 A1 | 2/2011 | Kalkanoglu et al. |
| 2011/0047902 A1 | 3/2011 | Cryar |
| 2011/0203637 A1 | 8/2011 | Patton et al. |
| 2011/0277825 A1 | 11/2011 | Fu et al. |
| 2011/0290307 A1 | 12/2011 | Workman et al. |
| 2012/0000502 A1 | 1/2012 | Wiedeman et al. |
| 2012/0012162 A1 | 1/2012 | Kobayashi |
| 2012/0031470 A1 | 2/2012 | Dimov et al. |
| 2012/0048349 A1 | 3/2012 | Metin et al. |
| 2012/0060911 A1 | 3/2012 | Fu et al. |
| 2012/0125391 A1 | 5/2012 | Pinarbasi et al. |
| 2012/0199184 A1 | 8/2012 | Nie et al. |
| 2012/0204927 A1 | 8/2012 | Peterson et al. |
| 2012/0237670 A1 | 9/2012 | Lim et al. |
| 2013/0048062 A1 | 2/2013 | Min et al. |
| 2013/0061913 A1 | 3/2013 | Willham et al. |
| 2013/0160823 A1 | 6/2013 | Khouri et al. |
| 2013/0206213 A1 | 8/2013 | He et al. |
| 2013/0209776 A1 | 8/2013 | Kim |
| 2013/0233378 A1 | 9/2013 | Moslehi et al. |
| 2013/0239495 A1* | 9/2013 | Pao ................ H02S 20/23 52/173.3 |
| 2013/0247959 A1 | 9/2013 | Kwon et al. |
| 2013/0255755 A1 | 10/2013 | Chich |
| 2013/0280521 A1 | 10/2013 | Mori |
| 2014/0120699 A1 | 5/2014 | Hua et al. |
| 2014/0124014 A1 | 5/2014 | Morad et al. |
| 2014/0196768 A1 | 7/2014 | Heng et al. |
| 2014/0246549 A1 | 9/2014 | West et al. |
| 2014/0313574 A1 | 10/2014 | Bills et al. |
| 2014/0360582 A1 | 12/2014 | Cui et al. |
| 2015/0090314 A1 | 4/2015 | Yang et al. |
| 2015/0155824 A1 | 6/2015 | Chien |
| 2015/0194552 A1 | 7/2015 | Ogasahara et al. |
| 2015/0243931 A1 | 8/2015 | Fukuura |
| 2015/0270410 A1 | 9/2015 | Heng et al. |
| 2015/0349145 A1 | 12/2015 | Morad et al. |
| 2015/0349152 A1 | 12/2015 | Voss et al. |
| 2015/0349703 A1 | 12/2015 | Morad et al. |
| 2016/0013329 A1 | 1/2016 | Brophy et al. |
| 2016/0105144 A1 | 4/2016 | Haynes et al. |
| 2016/0163902 A1 | 6/2016 | Podlowski |
| 2016/0181446 A1 | 6/2016 | Kalkanoglu et al. |
| 2016/0225931 A1 | 8/2016 | Heng et al. |
| 2017/0033250 A1 | 2/2017 | Ballif et al. |
| 2017/0077343 A1 | 3/2017 | Morad et al. |
| 2017/0194516 A1 | 7/2017 | Reddy et al. |
| 2017/0222082 A1 | 8/2017 | Lin et al. |
| 2017/0358699 A1 | 12/2017 | Juliano et al. |
| 2018/0054157 A1 | 2/2018 | Kapla et al. |
| 2018/0166601 A1 | 6/2018 | Inaba |
| 2018/0254738 A1 | 9/2018 | Yang et al. |
| 2018/0316302 A1 | 11/2018 | Okawa et al. |
| 2018/0351502 A1 | 12/2018 | Almy et al. |
| 2019/0028055 A1 | 1/2019 | Yang et al. |
| 2019/0260328 A1 | 8/2019 | Nguyen et al. |
| 2020/0044599 A1 | 2/2020 | Nguyen et al. |
| 2020/0076352 A1 | 3/2020 | Nadimpally et al. |

FOREIGN PATENT DOCUMENTS

| | | |
|---|---|---|
| CN | 102956730 B | 6/2016 |
| DE | 102007054124 A1 | 5/2009 |
| EP | 0828036 | 3/1998 |
| EP | 1058320 A2 | 12/2000 |
| EP | 1362967 | 11/2003 |
| EP | 1485547 A1 | 12/2004 |
| EP | 2051124 A2 | 4/2009 |
| EP | 2243901 | 10/2010 |
| EP | 2709160 A1 | 3/2014 |
| EP | 2784241 | 10/2014 |
| EP | 2784241 A1 * | 10/2014 |
| EP | 2950018 | 12/2015 |
| GB | 2278618 A | 12/1994 |
| GB | 2497276 | 6/2013 |
| JP | 57-141979 A | 9/1982 |
| JP | 60-20586 A | 2/1985 |
| JP | 6-140657 A | 5/1994 |
| JP | 6-264571 A | 9/1994 |
| JP | 2000-58894 A | 2/2000 |
| JP | 2000-91610 A | 3/2000 |
| JP | 2000-216415 A | 8/2000 |
| JP | 2001-012038 A | 1/2001 |
| JP | 2006-144267 A | 6/2006 |
| JP | 2013-211385 A | 10/2013 |
| KR | 10-1162675 B1 | 7/2012 |
| WO | 2003/074812 A1 | 9/2003 |
| WO | 2008/136872 A2 | 11/2008 |
| WO | 2009/062106 A1 | 5/2009 |
| WO | 2009/099418 A2 | 8/2009 |
| WO | 2009/137347 A2 | 11/2009 |
| WO | 2010/128375 A2 | 11/2010 |
| WO | 2011/128757 A1 | 10/2011 |
| WO | 2013/059441 A1 | 4/2013 |
| WO | 2013/067541 A1 | 5/2013 |
| WO | 2013/102181 A1 | 7/2013 |
| WO | 2014/178180 A1 | 11/2014 |
| WO | 2015/155356 A1 | 10/2015 |
| WO | 2016024310 | 2/2016 |
| WO | 2016/090341 A1 | 6/2016 |

OTHER PUBLICATIONS

International Patent Application No. PCT/US2018/035924, "International Search Report and Written Opinion", dated Sep. 12, 2018, 12 pages.
Advisory Action received for U.S. Appl. No. 15/686,109, dated Jun. 16, 2020, 3 pages.
Bulucani et al., "A New Approach: Low Cost Masking Material and Efficient Copper Metallization for Higher Efficiency Silicon Solar Cells", IEEE, 2015, 6 pages.
Fan et al., "Laser Micromachined Wax-Covered Plastic Paper as Both Sputter Deposition Shadow Masks and Deep-Ultraviolet Patterning Masks for Polymethylmacrylate-Based Microfluidic Systems", vol. 12, No. 4, Journal of Micro/ Nanolithography, MEMS, and MOEMS, Oct. 2013, pp. 1-6.
Final Office Action received for U.S. Appl. No. 15/909,181, dated Dec. 20, 2018, 23 pages.
Final Office Action received for U.S. Appl. No. 15/656,794, dated Jul. 29, 2019, 19 pages.
Final Office Action received for U.S. Appl. No. 15/686,109, dated Dec. 12, 2019, 10 pages.
International Preliminary Report on Patentability received for PCT Patent Application No. PCT/US2018/020508, dated Sep. 10, 2020, 10 pages.
International Preliminary Report on Patentability received for PCT Patent Application No. PCT/US2018/035918, dated Dec. 19, 2019, 11 pages.

(56) References Cited

OTHER PUBLICATIONS

International Preliminary Report on Patentability received for PCT Patent Application No. PCT/US2018/035924, dated Dec. 19, 2019, 8 pages.
International Preliminary Report on Patentability received for PCT Patent Application No. PCT/US2018/042418, dated Jan. 30, 2020, 12 pages.
International Search Report and Opinion received for PCT Patent Application No. PCT/US2018/035918, dated Nov. 6, 2018, 15 pages.
International Search Report and Written Opinion received for PCT Patent Application No. PCT/US2018/020508, dated Mar. 4, 2019, 14 pages.
International Search Report and Written Opinion received for PCT Patent Application No. PCT/US2018/042418, dated Nov. 28, 2018, 14 pages.
International Search Report and Written Opinion received for PCT Patent Application No. PCT/US2019/044308, dated Oct. 14, 2019, 9 pages.
Invitation to Pay Additional Fees received for PCT Patent Application No. PCT/US2018/020508, dated Jan. 9, 2019, 9 pages.
Non-Final Office Action received for U.S. Appl. No. 15/900,636, dated Jan. 28, 2020, 16 pages.
Non-Final Office Action received for U.S. Appl. No. 16/050,994, dated Sep. 23, 2020, 11 pages.
Notice of Allowance received for U.S. Appl. No. 15/656,794, dated Mar. 27, 2020, 10 pages.
Notice of Allowance received for U.S. Appl. No. 15/900,636, dated Aug. 6, 2020, 10 pages.
Notice of Allowance received for U.S. Appl. No. 15/909,181, dated Sep. 10, 2019, 11 pages.
Office Action received for Australian Patent Application No. 2018410566, dated Jul. 9, 2020, 9 pages.
Office Action received for European Patent Application No. 18711759.3, dated Sep. 24, 2020, 4 pages.
Pelisset et al., "Efficiency of Silicon Thin-Film photovoltaic Modules with a Front Coloured Glass", Proceeding of the CISBAT International Conference, 2011, 6 pages.
Poole et al., "Recovery Act: Organic Coatings as Encapsulants for Low Cost, High Performance PV Modules", Final Technical Report, PPG Industries Inc., Nov. 16, 2011, 35 pages.
Pre-Interview First Office Action received for U.S. Appl. No. 15/656,794, dated Apr. 16, 2019, 5 pages.
Pre-Interview First Office Action received for U.S. Appl. No. 15/686,109, dated May 24, 2019, 10 pages.
Pre-Interview First Office Action received for U.S. Appl. No. 15/909,181, dated Sep. 18, 2018, 6 pages.
Vyas et al., "An Inorganic/Organic Hybrid Coating for Low Cost Metal Mounted Dye Sensitized Solar Cells", 223rd ECS Meeting, the Electrochemical Society, 2013, 1 page.

\* cited by examiner

SIDELAP INTERCONNECT FOR PHOTOVOLTAIC ROOFING MODULES

CROSS-REFERENCES TO RELATED APPLICATIONS

This application claims priority under 35 USC 119(e) to U.S. Provisional Application No. 62/515,434, entitled "MULTI-REGION SOLAR ROOFING MODULES" and filed on Jun. 5, 2017, the contents of which are incorporated in their entirety and for all purposes. This application is also related to U.S. patent application Ser. No. 15/686,109, entitled "MULTI-REGION SOLAR ROOFING MODULES", scheduled to be filed concurrently with the present application, the entirety of which is herein incorporated by reference.

BACKGROUND

Solar panels are generally added to select regions of an existing roofing structure. Unfortunately, this can leave the roofing structure with a non-uniform appearance that many home or business owners would rather avoid. These conventional installations can include large panels that disrupt the more uniform aesthetic achieved by a traditional rooftop. In some cases, solar panel installation can even cause damage to exterior and/or interior roofing structures. Consequently, methods and apparatus for more seamlessly incorporating solar panels into roofing structures are desirable.

SUMMARY OF THE INVENTION

This disclosure describes various embodiments that relate to methods and apparatus for incorporating photovoltaic modules into a roofing structure.

A roofing structure is disclosed and includes the following: a first photovoltaic module; a second photovoltaic module; and a sidelap positioned between the first and second photovoltaic modules, the sidelap including: a water drainage component comprising an alignment ridge, the alignment ridge separating a first drainage channel from a second drainage channel and having a thickness sized to establish a gap between the first and second photovoltaic modules.

In some embodiments, a lateral side of the first panel overlaps the first drainage channel and a lateral side of the second panel overlaps the second drainage channel.

In some embodiments, the sidelap also includes a standoff protruding from one end of the sidelap.

In some embodiments, the first and second photovoltaic modules are solar roofing modules, each one of the solar roofing modules having the appearance of multiple roofing shingles.

In some embodiments, the sidelap also includes flow directors disposed at a down-roof end of the sidelap, the flow directors configured to distribute water evenly across photovoltaic modules positioned down-roof from the first and second photovoltaic modules.

In some embodiments, the sidelap includes a water drainage component and a base component that is separate and distinct from the water drainage component.

In some embodiments, the base component is coupled to the water drainage component by sliding a base of the base component into a drainage channel defined by the water drainage component.

In some embodiments, the sidelap includes both an attachment feature protruding from an up-roof end of the sidelap and a standoff protruding from a down-roof end of the sidelap.

In some embodiments, the roofing structure also includes a lattice of battens and counter battens. The attachment feature is secured to a first batten and the standoff is in contact with a second batten down-roof from the first batten.

In some embodiments, the first batten is substantially parallel to the second batten.

A solar roofing structure is disclosed and includes the following: a first photovoltaic laminate region embedded within a first roofing module; a second photovoltaic laminate region embedded within a second roofing shingle adjacent to the first roofing shingle; and a sidelap including an alignment ridge disposed between the first roofing module and the second roofing module, the alignment ridge establishing a minimum gap between the first and second roofing modules.

A method for installing solar roofing modules is disclosed and includes the following: installing a lattice of battens and counter battens atop a building; positioning a first solar roofing module atop two parallel battens; positioning one side of a sidelap beneath a lateral side of the first solar roofing module; and positioning a second solar roofing module atop the two parallel battens and against an alignment ridge of the sidelap.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
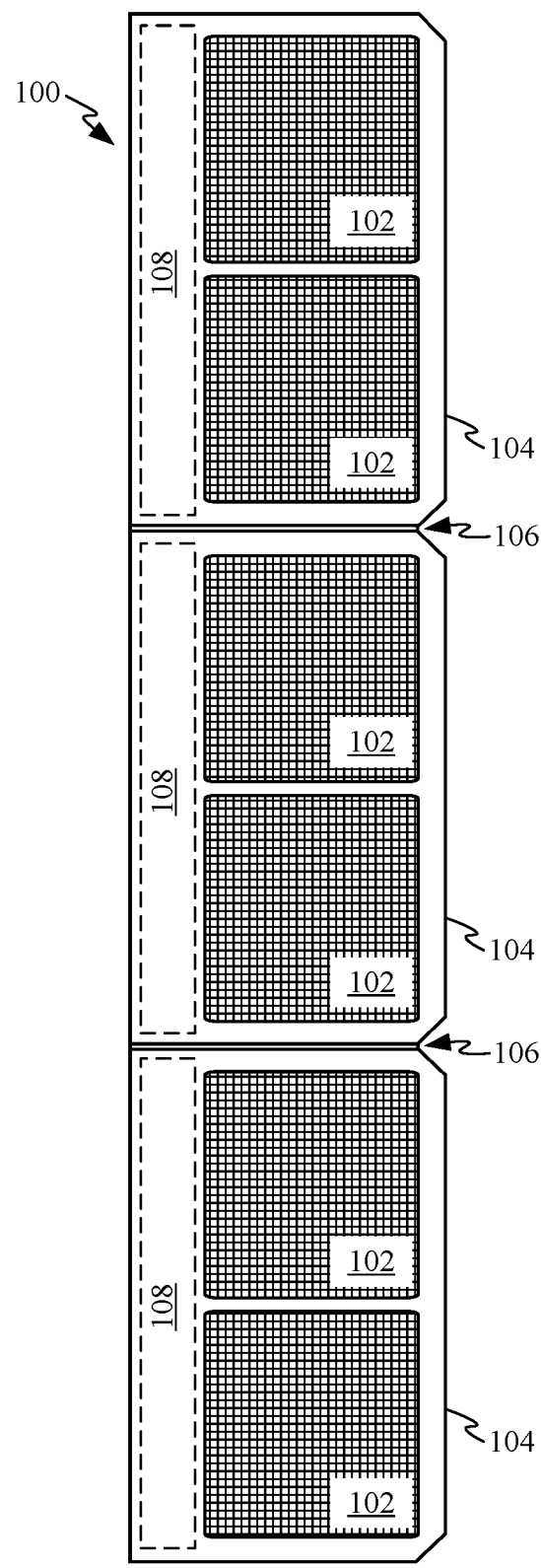
FIGS. 1A-1B show opposing sides of a solar roofing module suitable for incorporation into a roofing structure.

This description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the invention is not limited to the embodiments shown, but is to be accorded the widest scope consistent with the principles and features disclosed herein.

One way to avoid aesthetic problems generally associated with roof-mounted photovoltaic modules is to incorporate the photovoltaic modules into the roof itself. The photovoltaic modules can be incorporated into the roof by using photovoltaic modules taking the form of solar roofing modules to construct an exterior layer of the roof. Unfortunately, incorporating the photovoltaic modules and associated circuitry into discrete conventionally-sized shingles can be quite time-intensive due to the large number of electrical connections that would be required, thereby substantially increasing installation costs. One solution to this problem is to form a roofing module having the appearance of multiple conventional shingles in order to reduce the number of discrete modules needing to be wired together to achieve a roofing structure having a traditional shingle aesthetic. The roofing module can include a gap between a first region of the module representing a first shingle and a second region of the module representing a second shingle. The gap can then create the appearance of the panel being multiple shingles. Sidelaps can be installed between adjacent modules and establish a gap between the roofing modules equivalent to the gaps between the multiple regions making up a single module. The array of solar roofing modules can also be designed to allow for the easy removal of solar roofing modules, so that the solar roofing modules can be repaired or replaced without affecting the entire roofing structure. The solar roofing modules can also include features designed to distribute the flow of rain off the roof and to remain in place during severe weather.

While the following drawings depict solar roofing modules having the appearance of three discrete shingles it should be appreciated that solar roofing modules can have the appearance of fewer and larger numbers of shingles. For example, in some embodiments, a size of a solar roofing module could vary between two and five shingles. The varying numbers of shingles per solar roofing module allows the amount of roof coverage achieved by the solar roofing modules to be increased. In general, having more flexibility in panel width/size allows obstructions along the rooftop to be accommodated without substantially reducing the area of the roof occupied by solar roofing modules, as these areas are generally covered using flashing covers that do not contribute to the overall energy collection capability of the roofing structure.

These and other embodiments are discussed below with reference to FIGS. 1-13; however, those skilled in the art will readily appreciate that the detailed description given herein with respect to these figures is for explanatory purposes only and should not be construed as limiting.

Figure 1B:
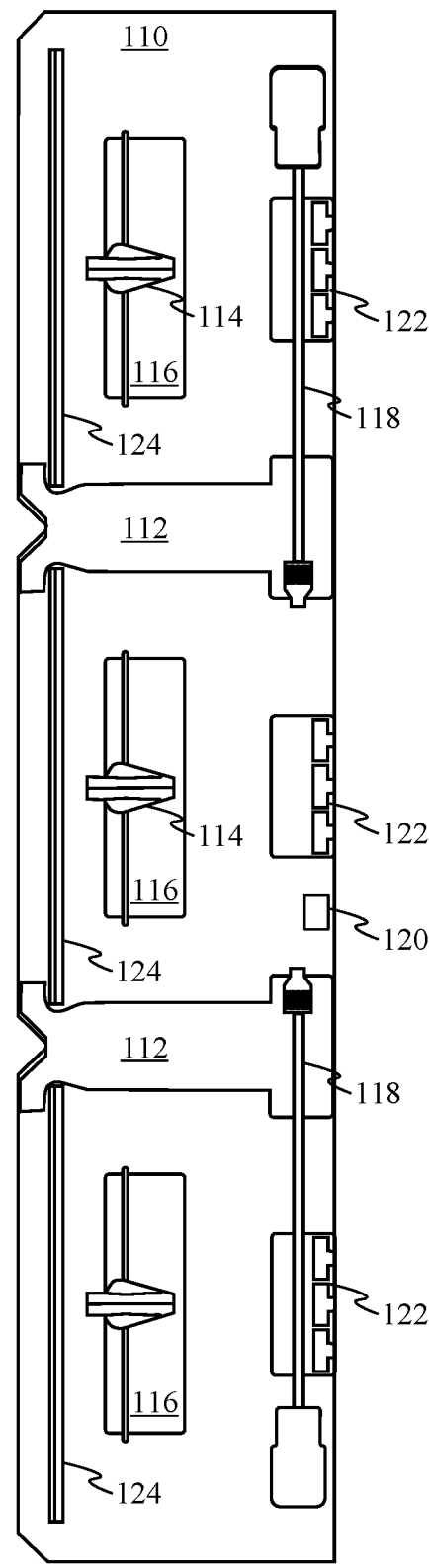

FIGS. 1A-1B show opposing sides of solar roofing module 100 suitable for incorporation into a roofing structure. FIG. 1A shows a first side of solar roofing module 100 and an array of photovoltaic laminate regions 102 distributed in a row along the first side of solar roofing module 100. Each pair of photovoltaic laminate regions 102 can be covered by protective cover 104 that can serve multiple purposes. Protective covers 104 can protect photovoltaic laminate regions 102 from damage and obscure photovoltaic laminate regions 102 from view without substantially reducing the amount of solar energy received by photovoltaic laminate regions 102 in order to create a more uniform cosmetic appearance for solar roofing module 100. In some embodiments, protective covers 104 can take the form of hardened glass having a geometry meant to mimic the shape of traditional roofing shingles. By leaving gap 106 between each protective cover 104, each solar roofing module 100 can have the appearance of three discrete shingles. Photovoltaic laminate regions 102 can be sized to remain clear of overlap regions 108 of solar roofing module 100. Overlap regions 108 can be left free of photovoltaic modules since an up-roof solar roofing module 100 can cover overlap regions 108 once a roofing installation is complete.

FIG. 1B shows a second side of solar roofing module 100 and how shingle array substrate 110 provides a common support structure for solar roofing module 100. Regions of shingle array substrate 110 defining gaps 106 can be reinforced by stiffening members 112 in order to give solar roofing module 100 a more consistent stiffness. Alternatively, stiffening members 112 can instead join multiple discrete shingle array substrates together and could include water run-off channels designed to guide rain passing between protective covers 104 down the rooftop. The second side also includes a number of batten hooks 114 that are configured to keep solar roofing module 100 from sliding down the rooftop by engaging battens that keep the solar roofing modules in place and also help align adjacent solar roofing modules 100 together. Batten hooks 114 are coupled to shingle array substrate 110 by rails 116, which allow for lateral adjustment of batten hooks 114. While multiple discrete rails 116 are shown it should be appreciated that single rail 116 could span a majority of the length of solar roofing module 100 allowing for even more flexibility in the placement of batten hooks 114. It might be necessary to shift the lateral position of one or more of batten hooks 114 to avoid interference caused by the presence of one or more counter battens, which generally run vertically up and down a rooftop and will be depicted in subsequent drawings.

FIG. 1B also shows electrical interconnections between photovoltaic laminate regions 102. Electrical conduits 118 help to combine the power generated by all of the photovoltaic modules so that solar roofing module 100 need have only one power connector 120, through which all power generated can be offloaded from solar roofing module 100. FIG. 1B also depicts standoffs 122, which help set a desired amount of standoff between an up-roof end of solar roofing module 100 and the batten upon which the up-roof end of solar roofing module 100 rests. A down-roof end of solar roofing module 100 can include seals 124 configured to contact the second side of overlap region 108 of an adjacent down-roof solar roofing module 100. Seals 124 can be compressed against an exterior surface of overlap regions 108 to help prevent the ingress of water between modules when blowing rain would otherwise make its way between solar roofing modules 100.

Figure 2:
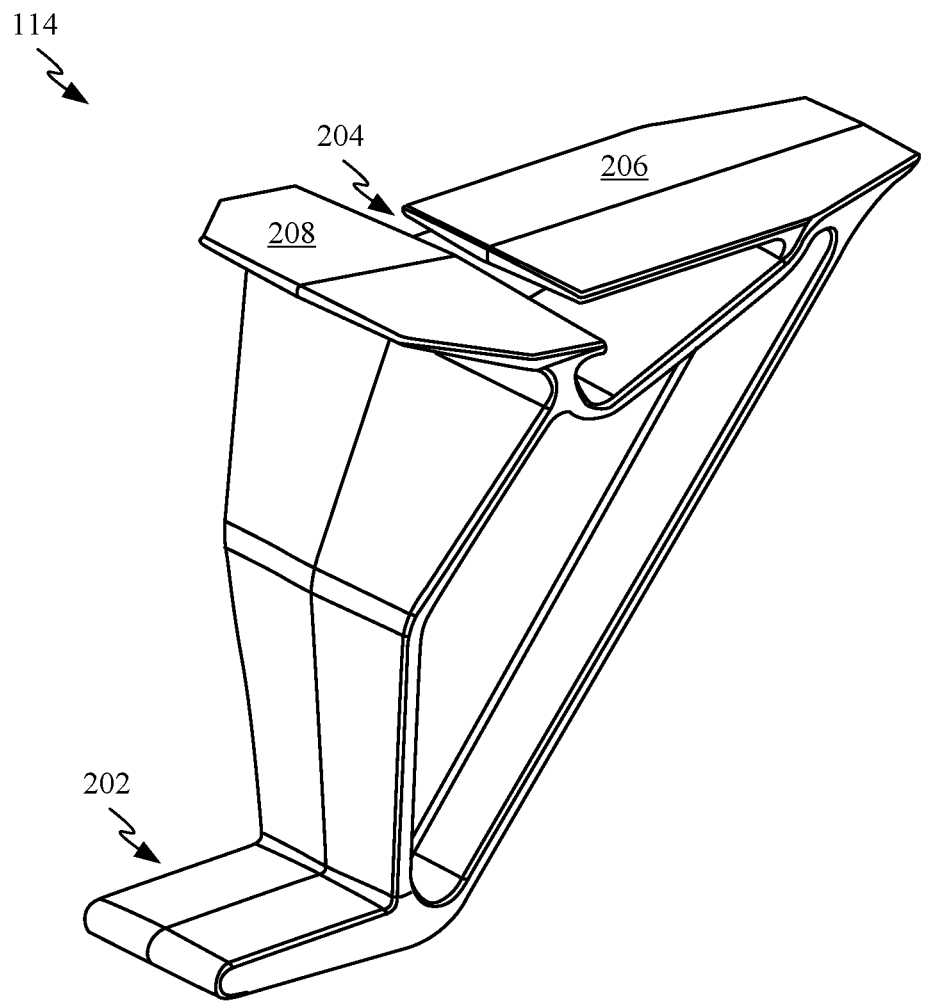
FIG. 2 shows a perspective view of one of batten hooks separated from the solar roofing module depicted in FIG. 1B.

FIG. 2 shows a perspective view of one of batten hooks 114 separated from solar roofing module 100. Batten hook 114 includes protrusion 202 configured to engage a downward facing surface of a batten in order to prevent an associated solar roofing module 100 from being lifted up and out of its position within a roofing structure. One or more adjacent up-roof solar roofing modules 100 also help keep solar roofing module 100 from being lifted upward by, for example, an extreme low pressure storm system. FIG. 2 also shows how batten hook 114 defines channel 204, which can receive a protruding member of one of rails 116.

Figure 3A:
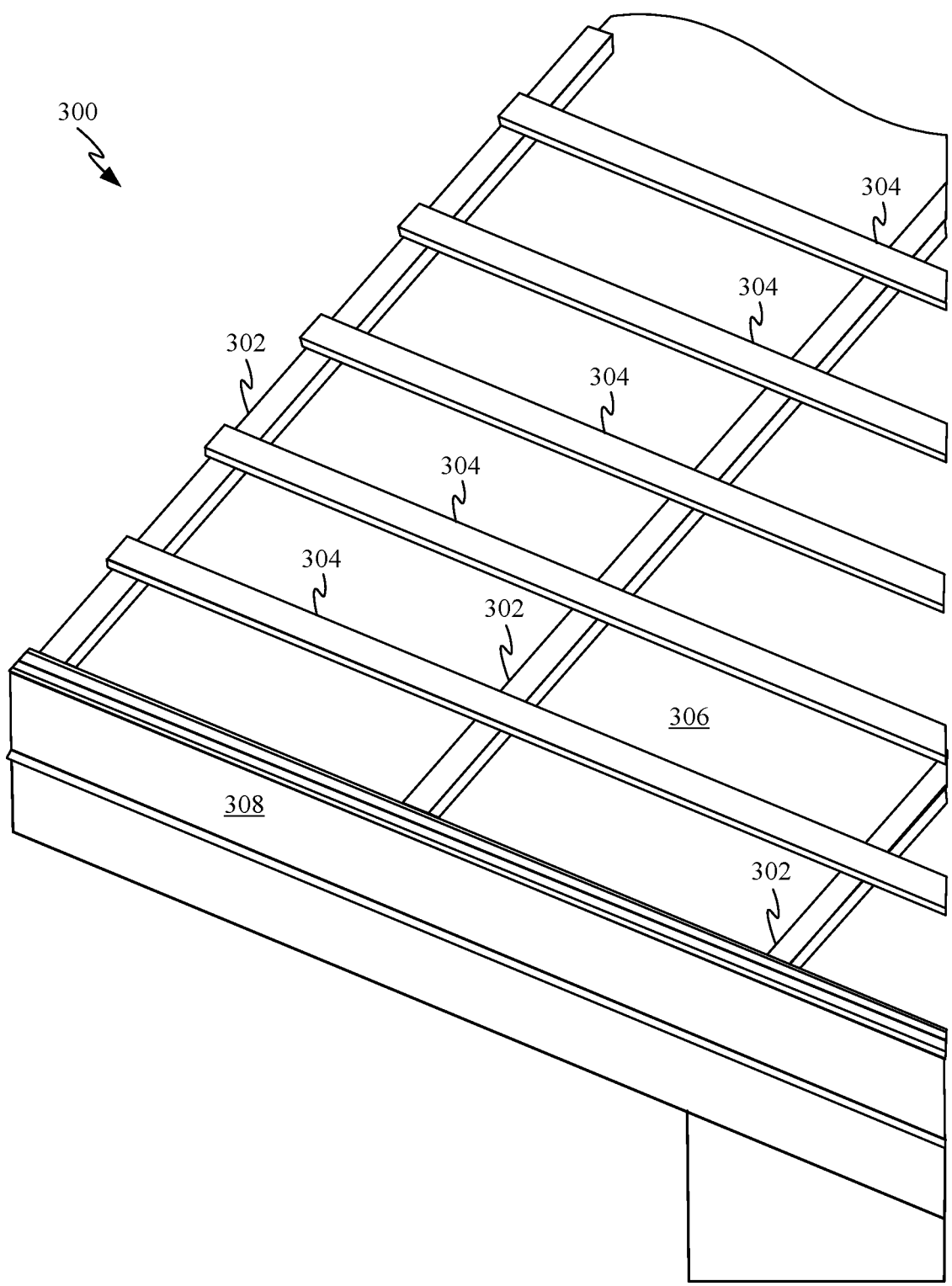
FIG. 3A shows a portion of an exemplary rooftop of a house with vertically-oriented counter battens and horizontally-oriented battens.

FIG. 3A shows a portion of an exemplary rooftop of house 300 with vertically-oriented counter battens 302 and horizontally-oriented battens 304 that cooperatively form a lattice structure configured to support an array of solar roofing modules. Battens 302 and counter battens 302 can be formed from any number of materials including, e.g., wood and metal beams. Protective cover 306 can be positioned between an upper surface of house 300 and counter battens 302. In some embodiments, protective cover 306 can take the form of a layer of waterproofing material capable of allowing water vapor to pass through it but preventing liquid water from passing through it. One specific example of such a material could include sheets of Tyvek®, i.e. a non-woven product consisting of spunbond olefin fiber, configured to help keep water from ingressing into house 300. FIG. 3A also shows how skirt member 308 can be arranged along a bottom edge of a rooftop of house 300. Skirt member 308 can block moisture from being blown beneath solar roofing modules mounted atop counter battens 302 and battens 304.

Figure 3B:
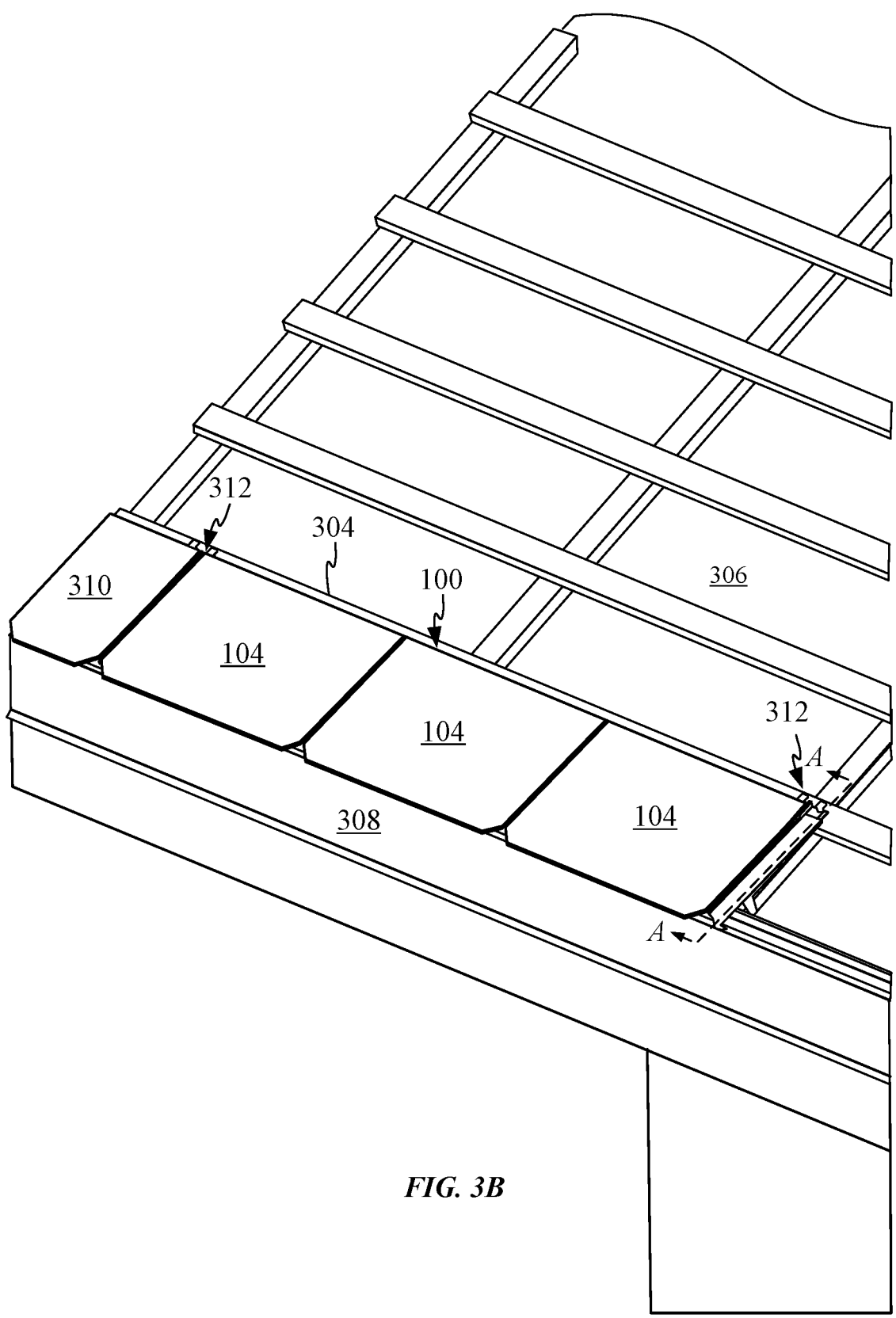
FIG. 3B shows a solar roofing module having a first side supported by a batten and a second side supported by a skirt member.

FIG. 3B shows solar roofing module 100 having a first side supported by batten 304 and a second side supported by skirt member 308. Flashing cover 310 is depicted mounted adjacent to one side of solar roofing module 100. Sidelaps 312 can be positioned on opposing sides of solar roofing module 100 in order to establish an interval between solar roofing module 100 and adjacent flashing cover 310 or other solar roofing modules 100. The interval set by sidelaps 312 can be substantially the same as the gaps between adjacent protective covers 104, making any variance between adjacent solar roofing modules 100 or flashing covers 310 cosmetically unnoticeable.

Figure 3C:
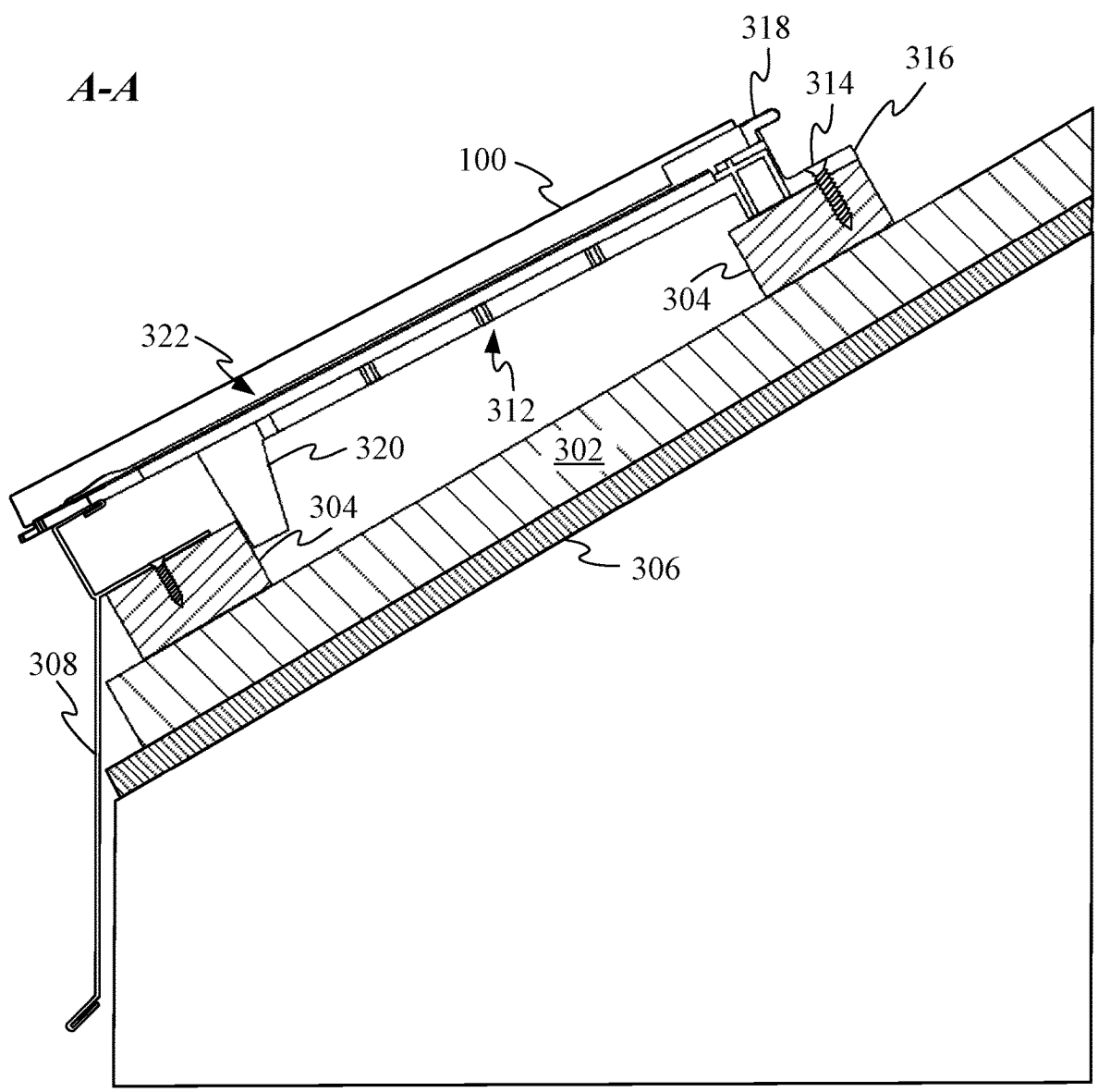
FIG. 3C shows a partial cross-sectional side view of a sidelap partially depicted in FIG. 3B in accordance with section line A-A as depicted in FIG. 3B.

FIG. 3C shows a partial cross-sectional side view of one of sidelaps 312 in accordance with section line A-A as depicted in FIG. 3B. A first end of sidelap 312 is shown secured to batten 304 by fastener 314. The first end can include attachment feature 316 that takes the form of a fastener tab defining an opening configured to receive fastener 314. As depicted, the fastener tab sits flush against an upper surface of batten 304. The first end also includes module tab 318, which can be configured to exert a biasing force oriented down-roof once a corresponding solar roofing module 100 is installed. Module tabs 318 can also be helpful in gauging whether an associated solar roofing module 100 is full seated against the lower batten Sidelap 312 also includes standoff 320, which contacts and rests against a lateral surface of batten 304. Standoff 320 helps establish a vertical position of sidelap 312 prior to sliding sidelap 312 against one side of solar roofing module 100. Installers can wait until an entire row of solar roofing modules 100 are in position to secure each of sidelaps 312 to battens 304 using fasteners 314. Standoff 320 is long enough to maintain contact with batten 304 while allowing water drainage assembly 322 to rest atop skirt member 308. In some embodiments, skirt member 308 can be formed from folded sheet metal and can include multiple fastener holes for securing skirt member 308 to batten 304, as depicted.

Figure 4A:
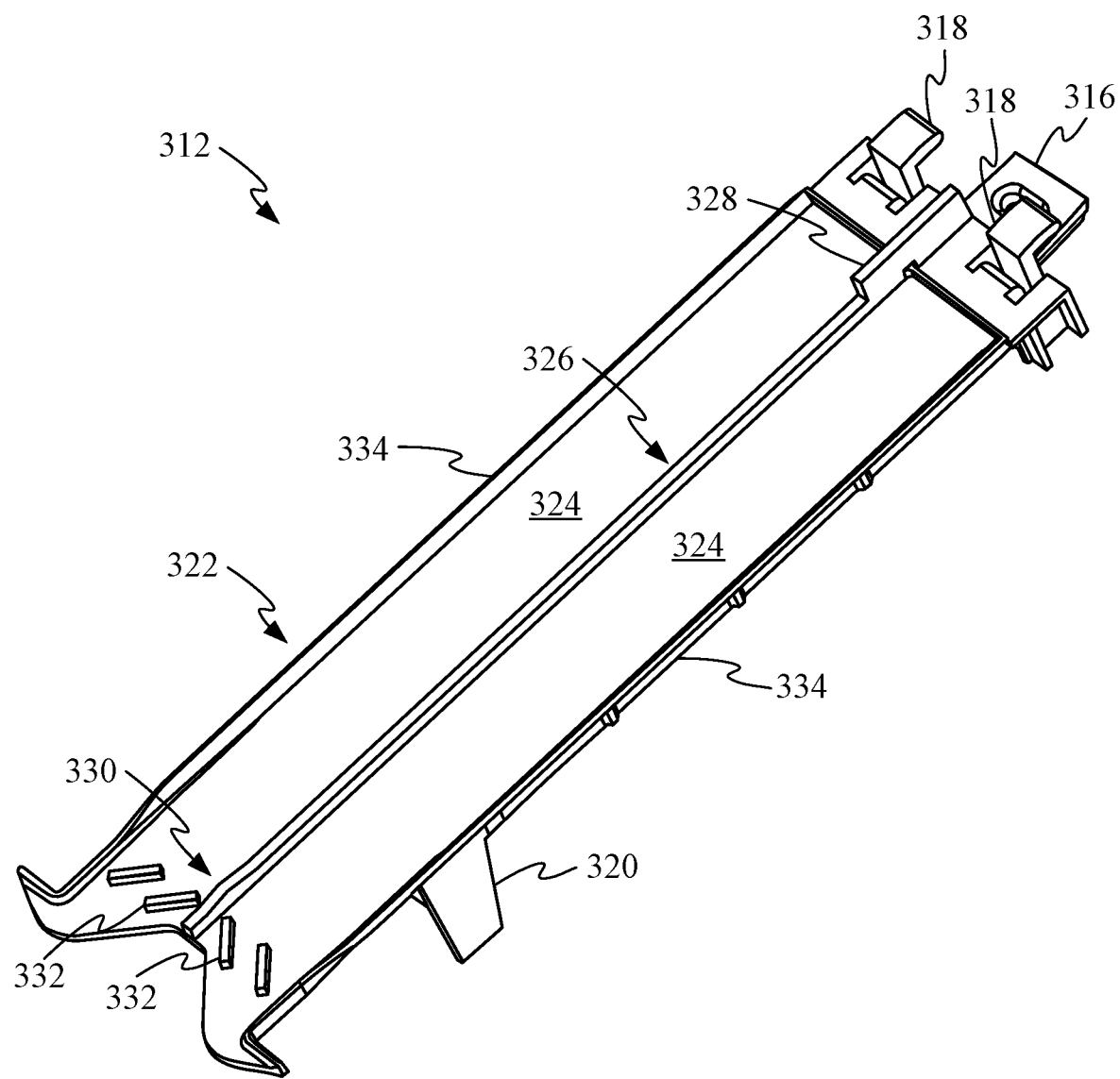
FIG. 4A shows a perspective view of a sidelap.

FIG. 4A shows a perspective view of sidelap 312. In particular, a clear view of water drainage assembly 322 is shown. Water drainage assembly includes two parallel drainage channels 324 that help guide water passing between solar roofing modules 100 down-roof. Water drainage assembly 322 also includes alignment ridge 326 positioned between drainage channels 324. Alignment ridge 326 has a thickness sized to establish a desired gap between adjacent solar roofing modules 100. A height of alignment ridge 326 varies along its length. An up-roof end 328 of alignment ridge 326 can be substantially taller than the rest of alignment ridge 326 and has nearly the same height as solar roofing modules 100. The increased height in this region has the advantage of increasing the effectiveness of alignment ridge 326 without reducing the aesthetic of the roofing structure. While this taller portion of alignment ridge 326 could be visible between solar roofing modules 100, its position at the top of sidelap 312 results in any visibility being blocked by up-roof panels which cover the taller portion of alignment ridge 326. The rest of alignment ridge 326 can be suitably short to avoid visibility. Lower end 330 of alignment ridge 326 can be slightly raised to reduce the likelihood of the lower end of sidelap 312 inadvertently sliding under solar roofing module 100 during installation. Finally, the down-roof end of drainage channels 324 can include flow directors 332 operative to distribute the water as it leave drainage channels 324. It should be noted that drainage channels 324 are also defined by sidewalls 334, which help to prevent liquid within drainage channels 324 from flowing toward and beneath solar roofing modules 100. Since solar roofing modules 100 rest atop sidewalls 334, liquid within drainage channels 324 are biased by gravity to flow down-roof. Consequently, the interface between solar roofing modules 100 and sidewalls 334 prevents liquid from flowing over the edge of sidewalls 334.

Figure 4B:
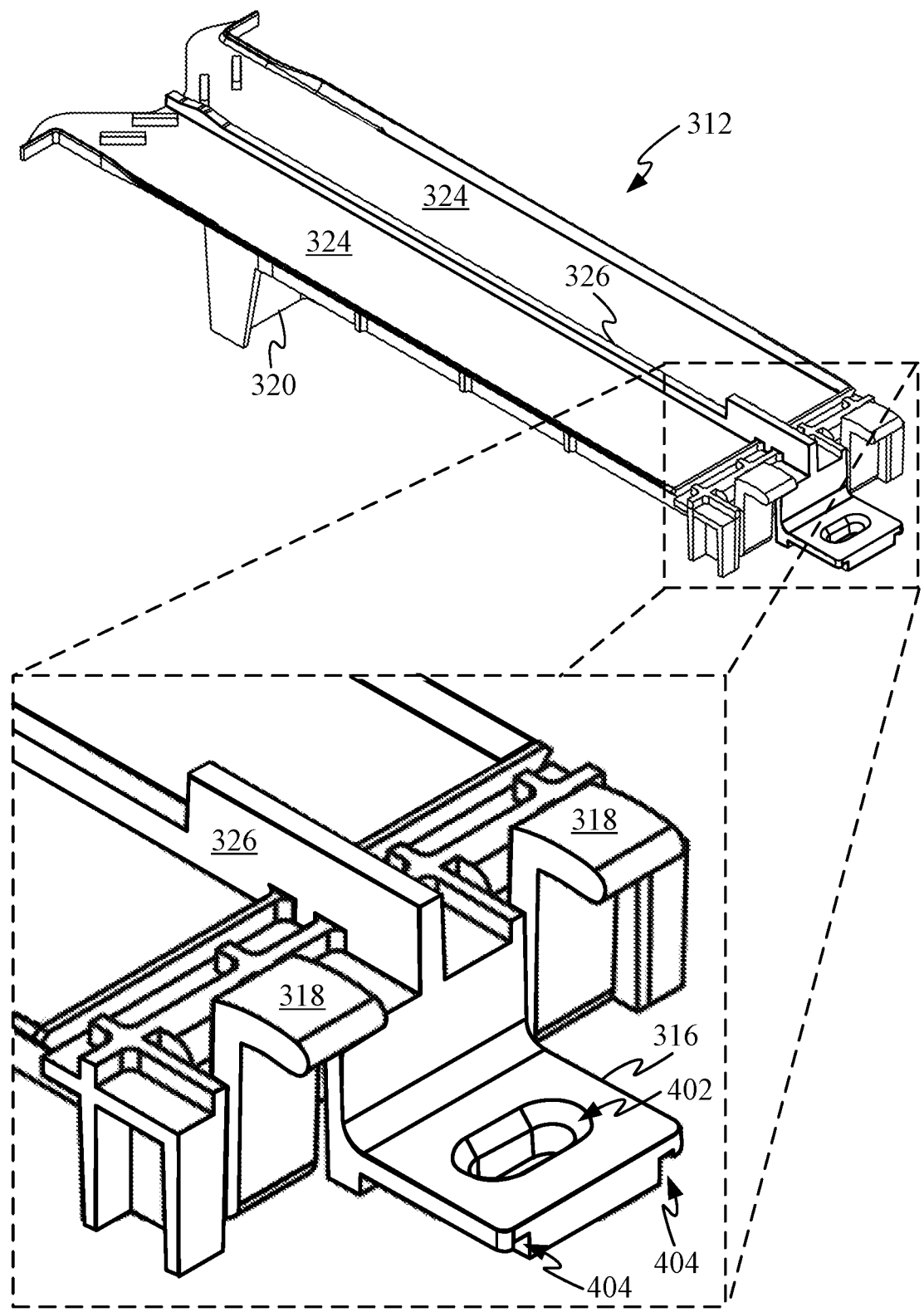
FIG. 4B shows another perspective view of the sidelap depicted in FIG. 4A, including a close up view of an up-roof end of the sidelap.
Figure 4C:
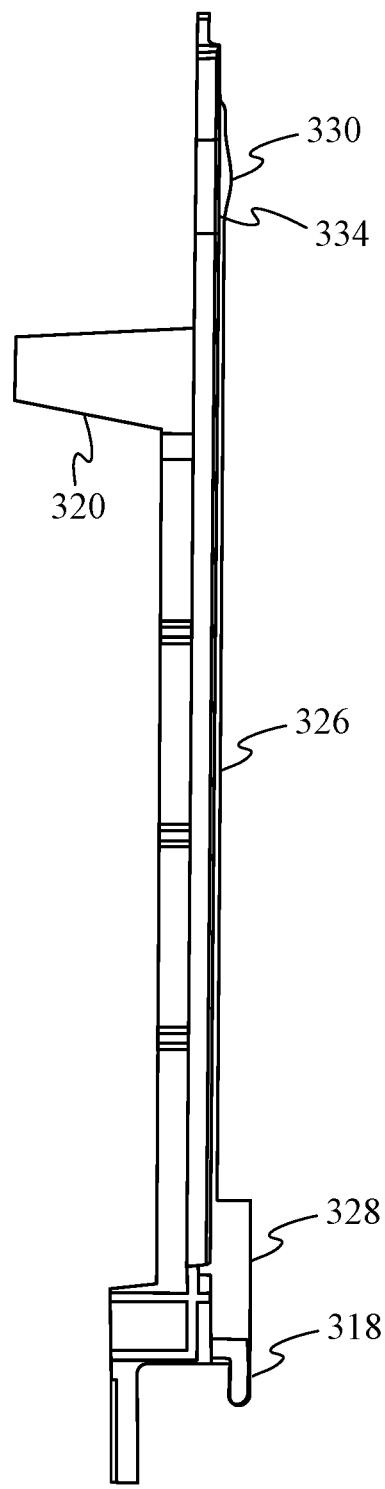
FIG. 4C shows a side view of the sidelap depicted in FIGS. 4A-4B.

FIG. 4B shows another perspective view of sidelap 312, including a close up view of an up-roof end of sidelap 312. In particular, the closeup view shows more details of attachment feature 316. In particular, one possible shape of fastener opening 402 is shown. As shown, this non-circular opening allows for a fastener extending through fastener opening 402 to be shifted laterally to provide flexibility for the placement of the fastener. FIG. 4B also depicts undercut features 404, which are sized to aid in attachment of a wire clip to attachment feature 316. FIG. 4C shows a side view of sidelap 312. FIG. 4C shows how even the lowest portion of alignment ridge 326 is slightly taller than sidewalls 334. FIG. 4C also shows how up-roof end 328 of alignment ridge 326 has about the same height is module tabs 318.

Figure 5A:
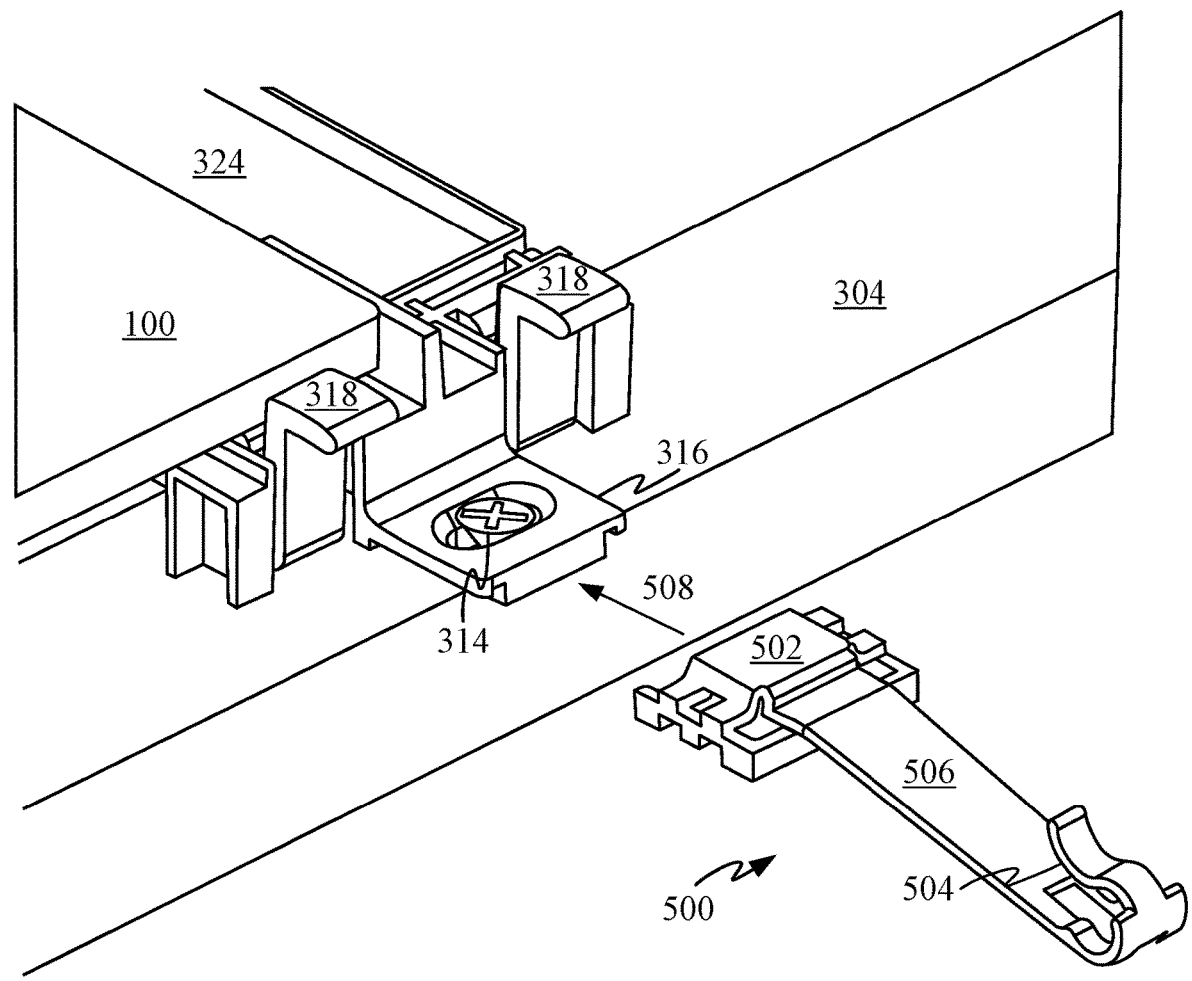
FIGS. 5A-5B show how a wire clip can be coupled to an attachment feature of the sidelap depicted in FIGS. 4A-4B.
Figure 5B:
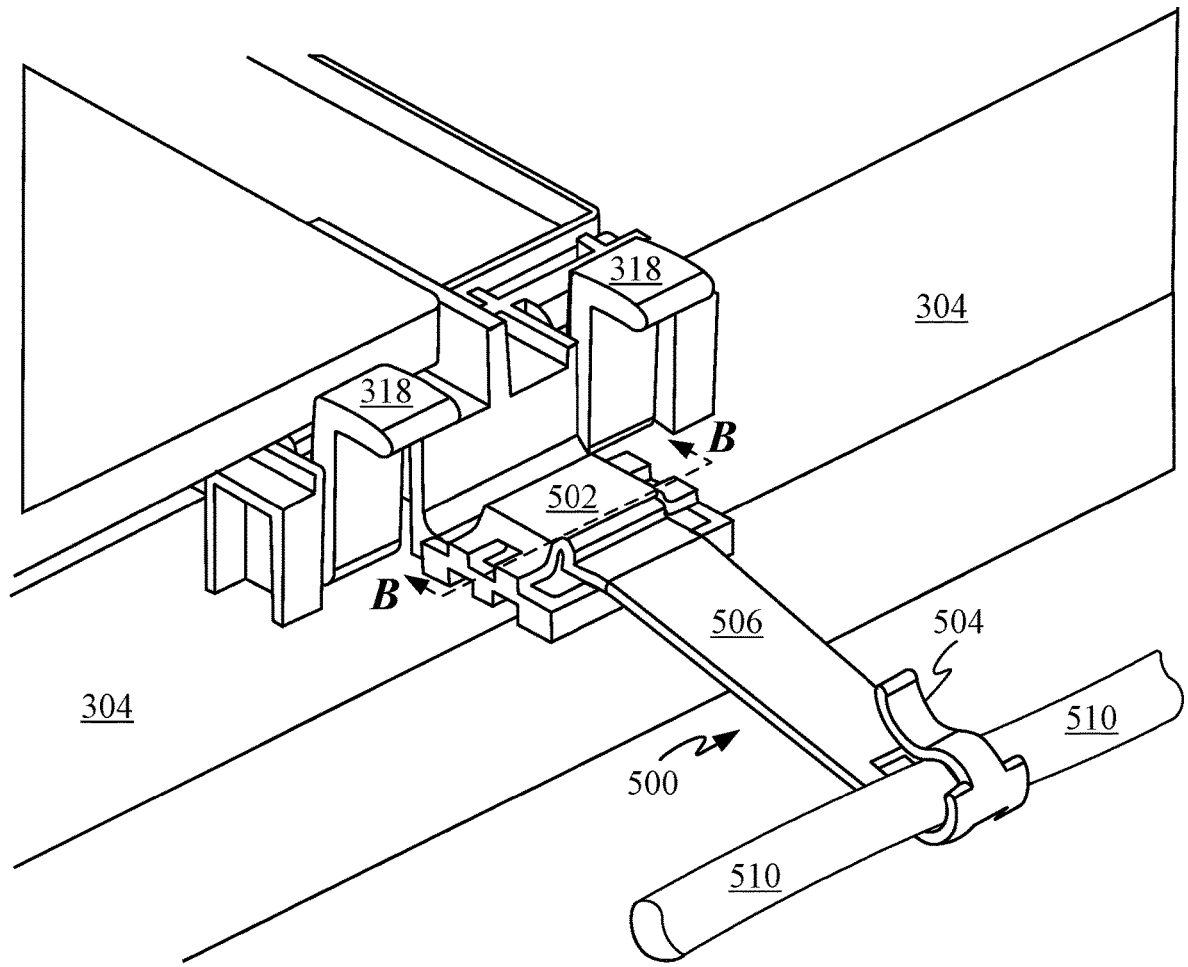

FIGS. 5A-5B show how wire clip 500 can be coupled to attachment feature 316. FIG. 5A shows how wire clip includes attachment bracket 502 for coupling wire clip 500 to attachment feature 316. Attachment bracket 502 is connected to wire retaining structure 504 by arm 506. Wire retaining structure 504 can include a hook configured to receive and retain a portion of one or more wires associated with the roofing structure. It should be noted that a size and shape of wire clip could vary to accommodate various design goals. Wire clip 500 can be moved in direction 508 to attach it to attachment feature 316.

Figure 5C:
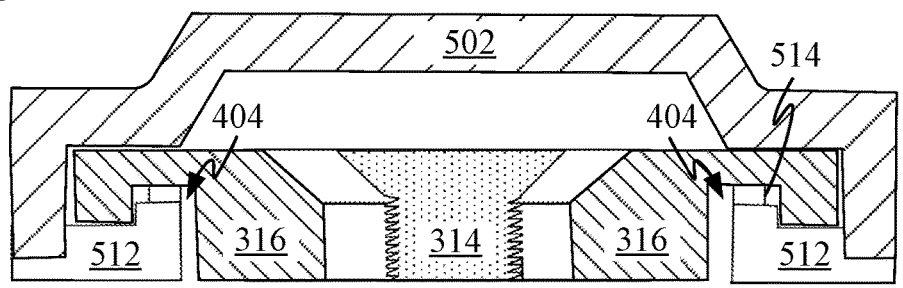
FIG. 5C shows a cross-sectional view of an attachment bracket engaged with an attachment feature.

FIG. 5B shows attachment bracket 502 of wire clip 500 after being slid on to attachment feature 316. Cable 510 is depicted captured within wire retaining structure 504. FIG. 5C shows a cross-sectional view of attachment bracket 502 engaged with attachment feature 316 in accordance with section line B-B. Teeth 512 are depicted captured within undercut features 404. In some embodiments, one or more of teeth 512 of attachment bracket 502 can include locking feature 514, which is configured to resist removal of wire clip 500 from attachment feature 316 by cutting into attachment feature 316 when a removal force is applied to wire clip 500. FIG. 5C also shows how a central portion of attachment bracket 502 is raised up above attachment feature 316 leaving room for a large fastener head for fastener 314 to protrude above an upper surface of attachment feature 316.

Figure 6A:
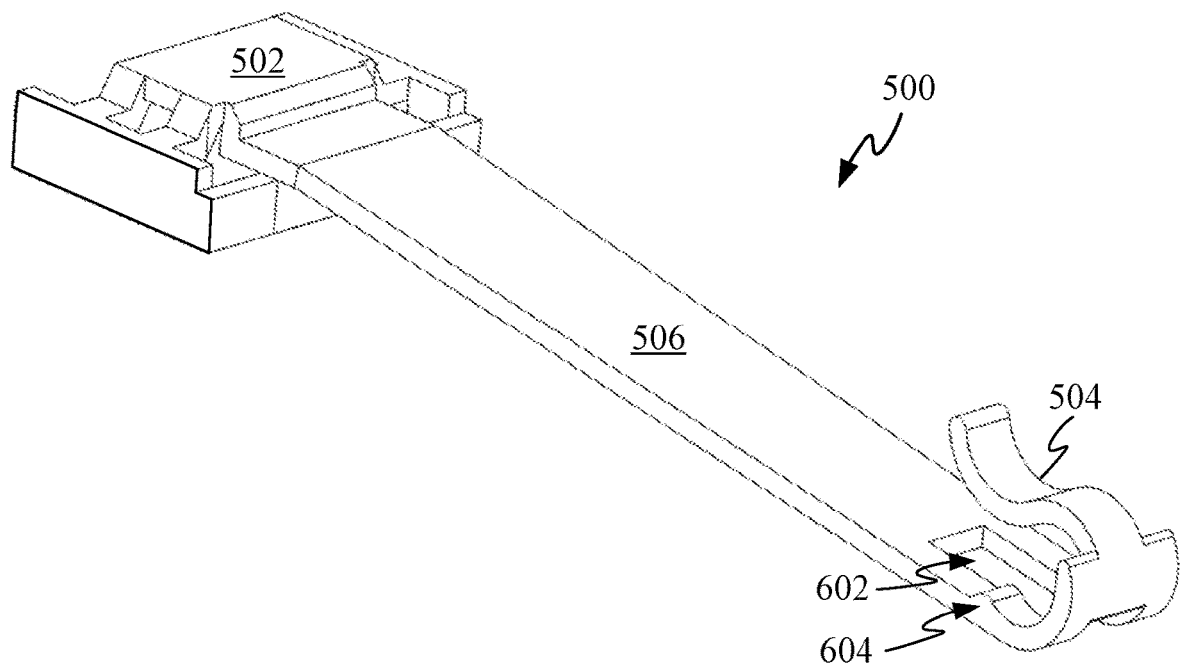
FIGS. 6A-6B show perspective views of a wire clip.
Figure 6B:
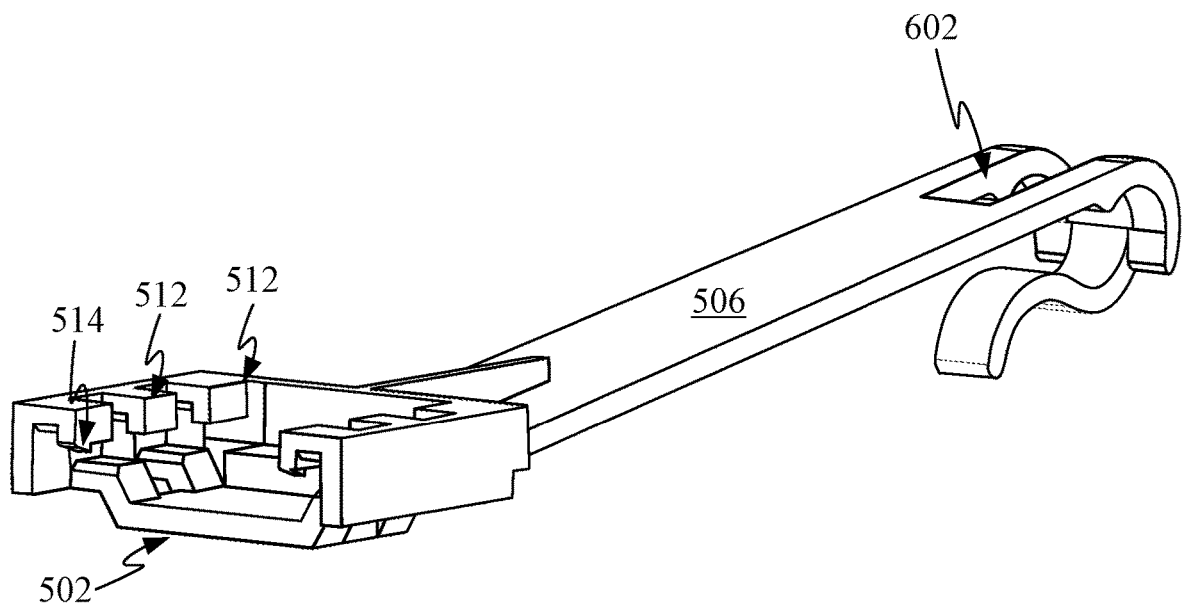

FIGS. 6A-6B show perspective views of wire clip 500. In particular, a stiffness of wire retaining structure 504 can be tuned by removing a portion of the material making up wire retaining structure 504. The removed material can leave an opening 602 defined by two narrow connections linking wire retaining structure 504 to arm 506. Each of the narrow connections can include bump 604 that helps lock a wire within wire retaining structure 504. FIG. 6B shows a geometry of locking features 514 and how it can have a wedge-shaped geometry that digs into material making up the undercut feature when removal is attempted.

Figure 7A:
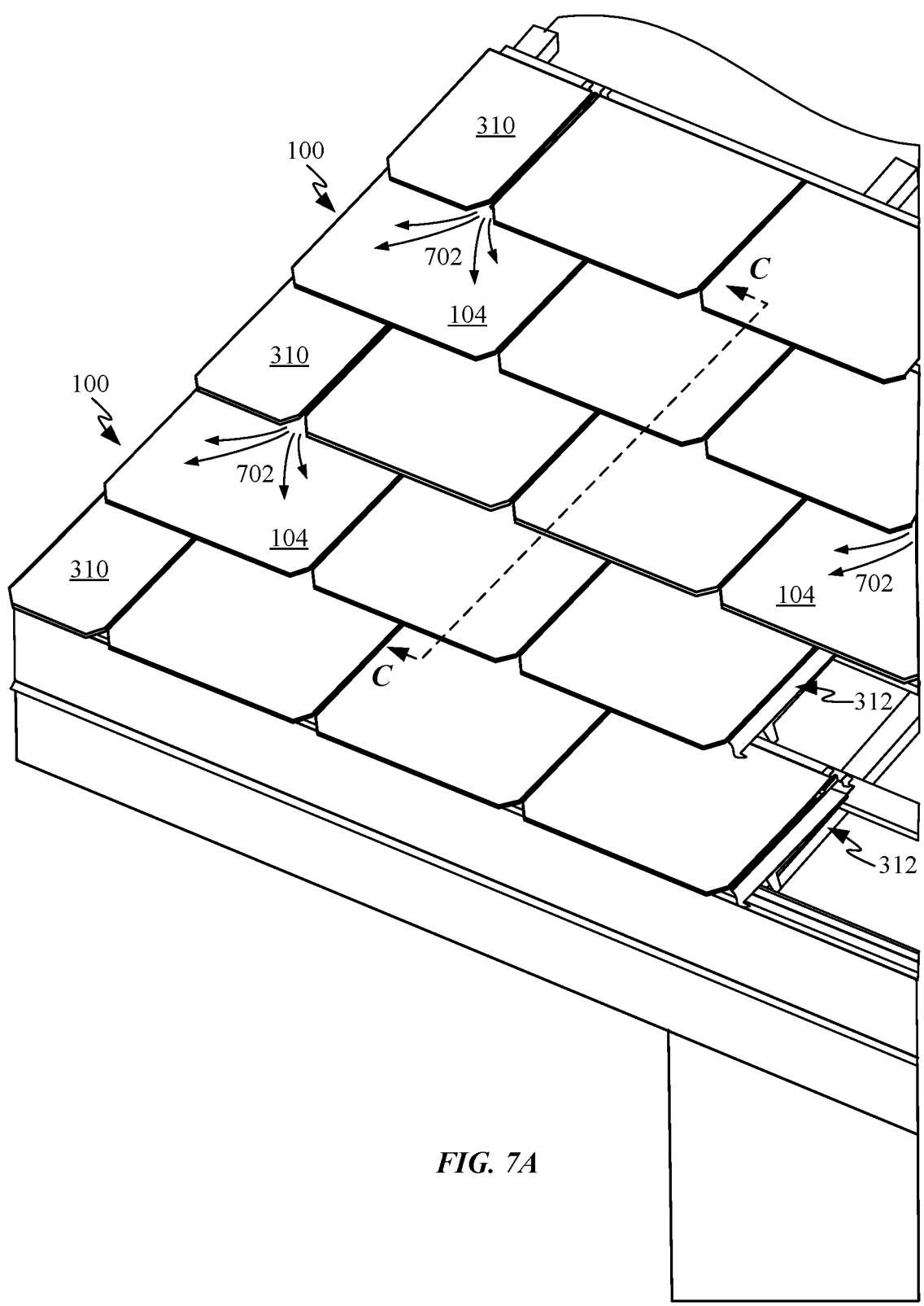
FIG. 7A shows a perspective view of a rooftop with multiple rows of solar roofing modules.

FIG. 7A shows a perspective view of a rooftop with multiple rows of solar roofing modules 100. Some of solar roofing modules 100 have been left off the rooftop to show the location of some of sidelaps 312. Flashing cover 310 having the appearance of a partial module can be used to create an offset between solar roofing modules 100. In this way, water directed by sidelaps 312 can be distributed more evenly across the rooftop. Waterflow arrows 702 represent the flow of water exiting sidelaps 312, showing how flow directors 332 (see FIG. 4A) of sidelaps 312 help distribute water evenly across down-roof protective covers 104. As depicted, this helps a majority of the water channeled by one of sidelaps 312 avoid falling into a sidelap two rows down. This can help to prevent sidelaps 312 positioned lower on a roofing structure from becoming saturated with water and overflowing due to water accumulation during heavy rains.

Figure 7B:
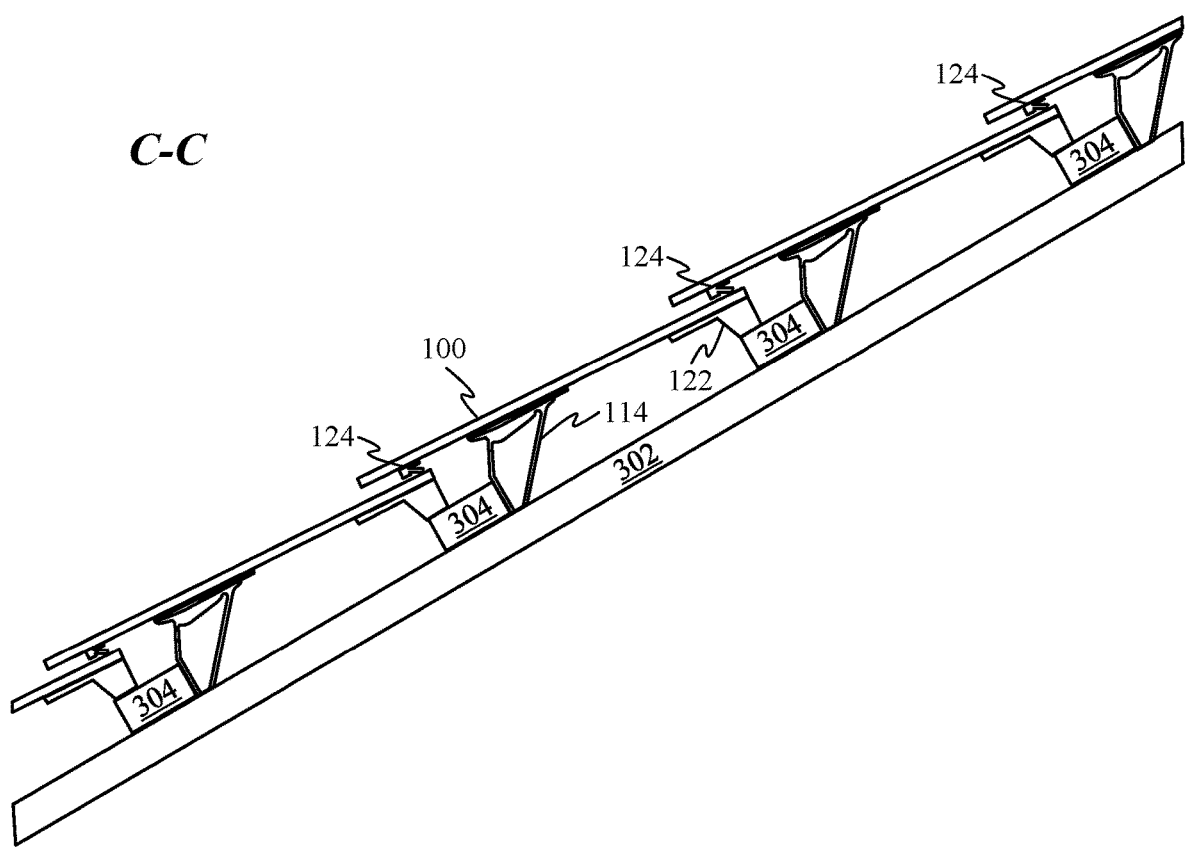
FIG. 7B shows a cross-sectional side view of three rows of installed solar roofing modules in accordance with section line C-C as depicted in FIG. 7A.

FIG. 7B shows a cross-sectional side view of three rows of installed solar roofing modules 100 in accordance with section line C-C as depicted in FIG. 7A. Batten hooks 114 are shown engaged with battens 304 to keep each of solar roofing modules 100 in place. FIG. 7A also shows how seals 704 can compress against an upward facing surface of solar roofing module 100 in order to keep blowing rain from flowing through openings between solar roofing modules 100. Standoffs 122 elevate the up-roof end of solar roofing module 100 above batten 304 a sufficient amount to accommodate the height of sidelaps 312.

Figure 7C:
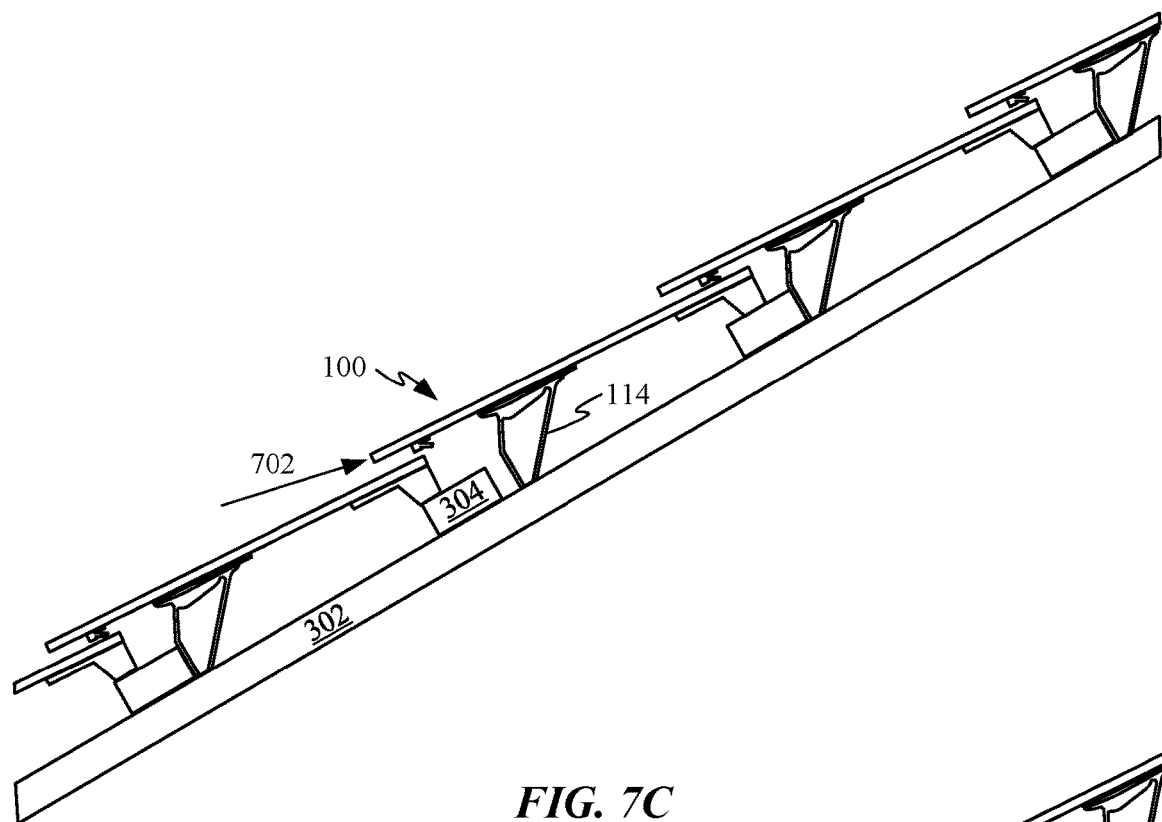
FIGS. 7C-7D show how a solar roofing module can be removed from a rooftop including an array of solar roofing modules.
Figure 7D:
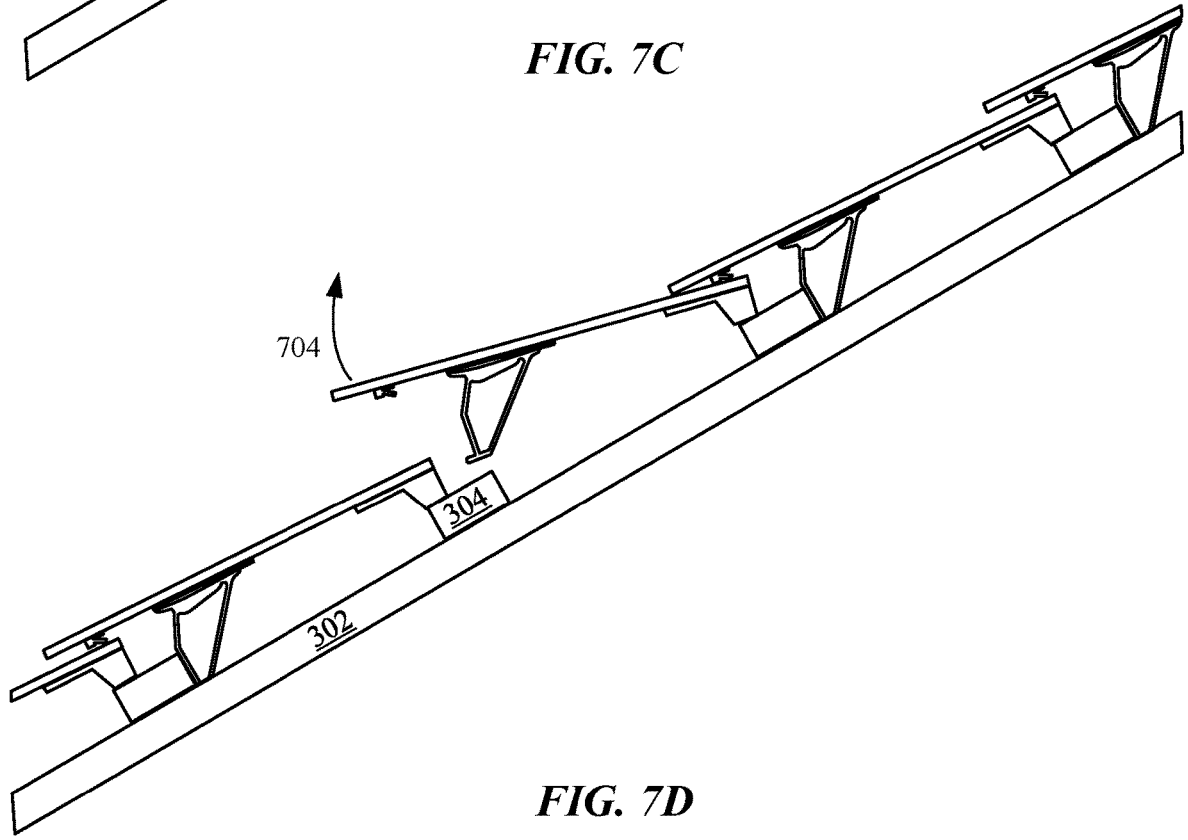

FIGS. 7C-7D show how one of solar roofing modules 100 can be removed from a rooftop. FIG. 7C shows a force 702 being exerted against a down-roof end of one of solar roofing modules 100 until batten hook 114 clears batten 304. FIG. 7D shows how force 704 can then rotate solar roofing module 100 upward until batten hook 114 clears the uppermost portion of the adjacent down-roof solar roofing module 100. At this point, once any wiring has been disconnected from solar roofing module 100 it can be removed for maintenance or replacement.

Figure 8A:
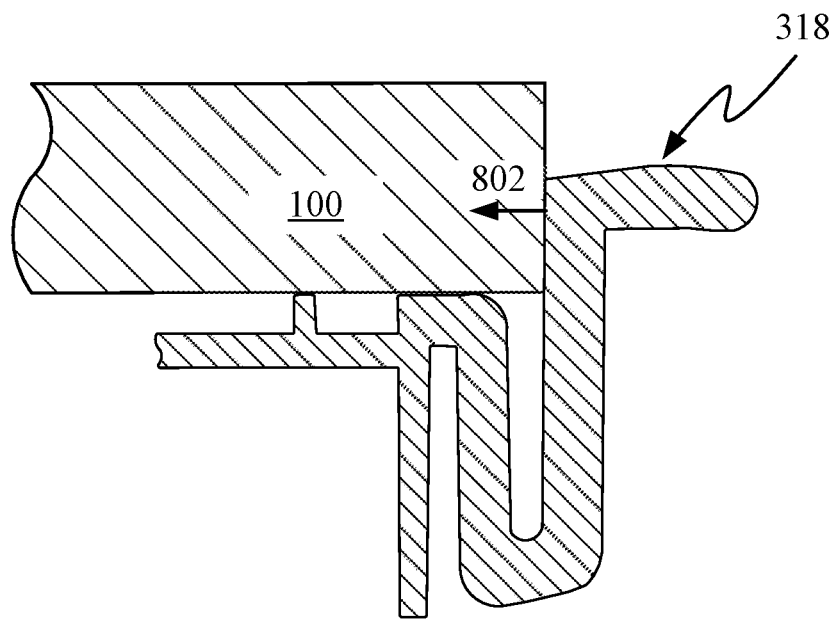
FIGS. 8A-8B show how module tabs of a sidelap can deform to accommodate removal of solar roofing modules.
Figure 8B:
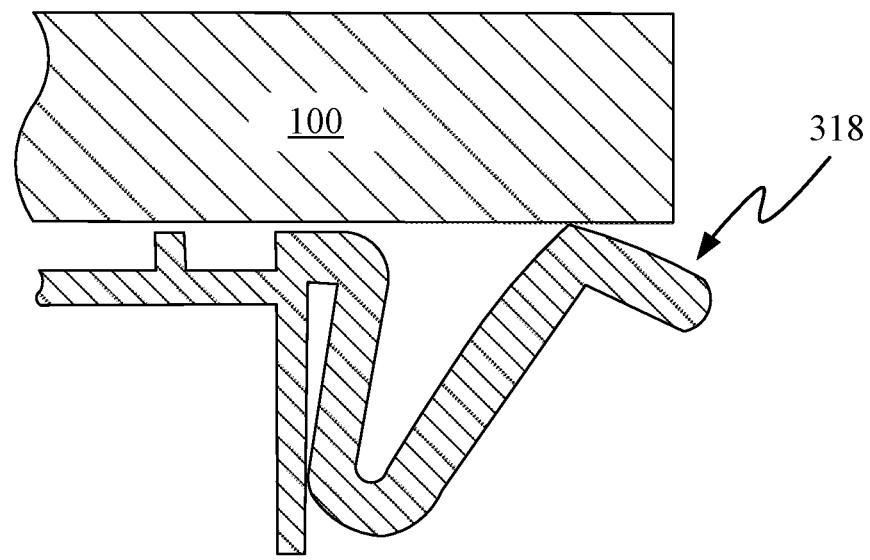

FIGS. 8A-8B show how module tabs 318 of sidelap 312 can deform to accommodate removal of solar roofing modules 100. FIG. 8A shows how module tab 318 can have a U-shaped geometry and in an installed state assert biasing force 802 against an up-roof end of solar roofing module 100. This configuration keeps solar roofing modules 100 in place by preventing the solar roofing modules from moving down-roof by the interaction between the batten hooks and a batten while module tabs 318 can exert biasing force 802 against solar roofing module 100 that in combination with the force of gravity prevents upward movement of solar roofing module 100. Lateral movement of solar roofing modules 100 is prevented by alignment ridges 326 of sidelaps 312.

FIG. 8B shows how module tab 318 can deform when a user slides solar roofing module up-roof during a panel removal operation. The deformation accommodates the motion of solar roofing module 100 necessary to remove one or more solar roofing modules 100 in the way shown in FIGS. 7B-7C and can deform elastically so that module tabs 318 return to the position shown in FIG. 8A after a solar roofing module removal operation.

Figure 9A:
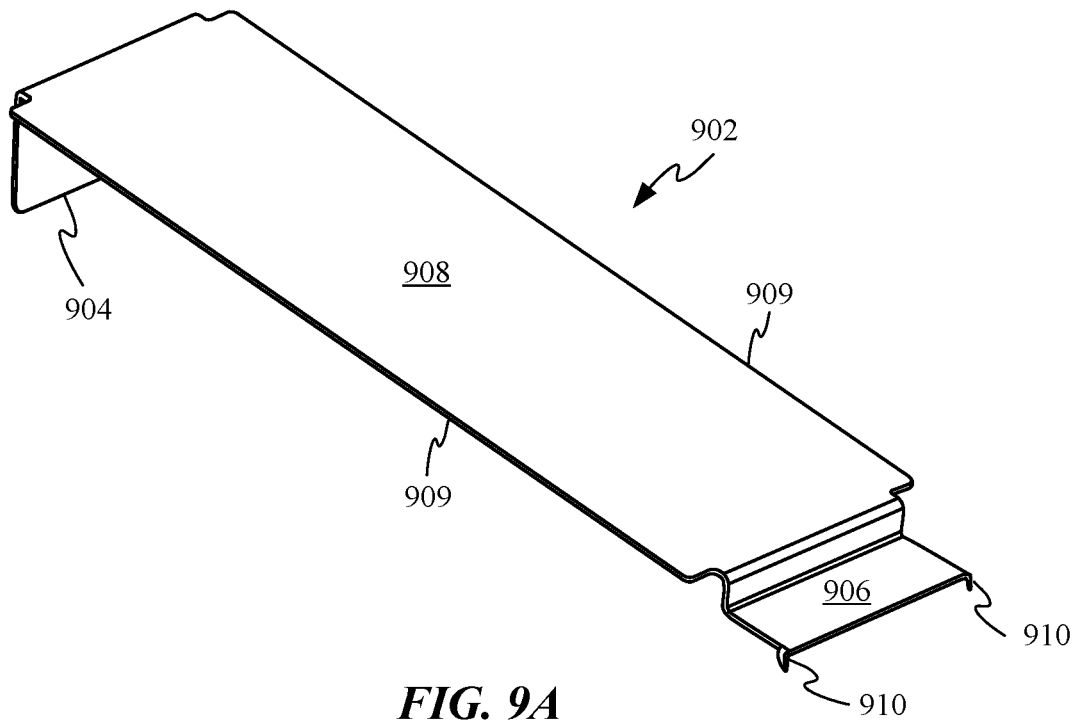
FIGS. 9A-9B show components of another sidelap embodiment.
Figure 9B:
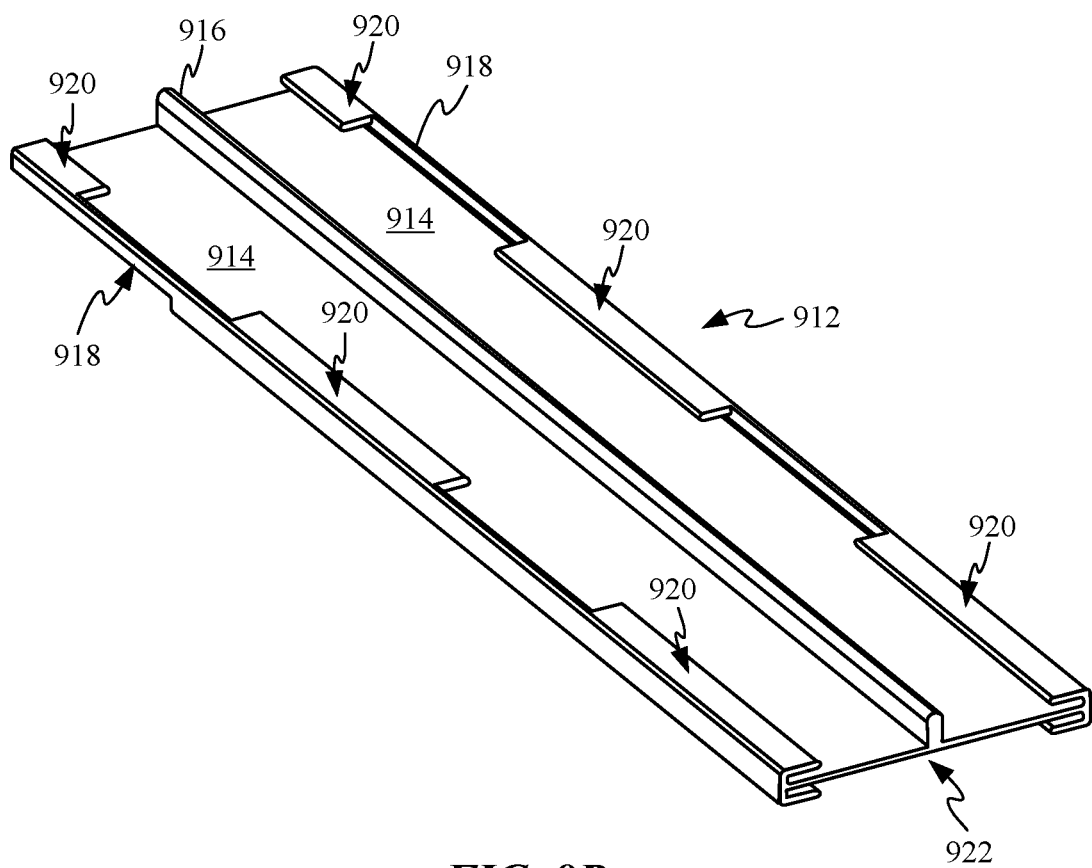

FIGS. 9A-9B show components of another sidelap embodiment. FIG. 9A shows base component 902, which includes standoff 904 and attachment feature 906 joined by base 908. Base 908 can include wings 909 protruding laterally from base 908. Base component 902 can be formed of a sturdy material such as sheet metal to make it convenient to form by a metal shaping operation such as stamping and folding. A portion of base component 902 that joins attachment feature 906 to base 908 can be bent to position attachment feature 906 below base 908. Attachment feature 906 can include protruding spikes 910, which can be embedded within a surface of a batten. This removes the need for a separate fastener to secure attachment feature 906 to a batten.

FIG. 9B shows water drainage component 912, which include parallel drainage channels 914. Each of drainage channels 914 are defined by alignment ridge 916 and a corresponding one of sidewalls 918. Each of sidewalls 918 includes a number of tabs 920 extending from a top edge of sidewalls 918 and toward alignment ridge 916. A bottom portion of water drainage component 912 defines an attachment channel 922 sized to receive wings 909 of base 908 of base component 902. Wings 909 refer to the portion of base 908 extending wider than standoff 904 and attachment feature 906.

Figure 9C:
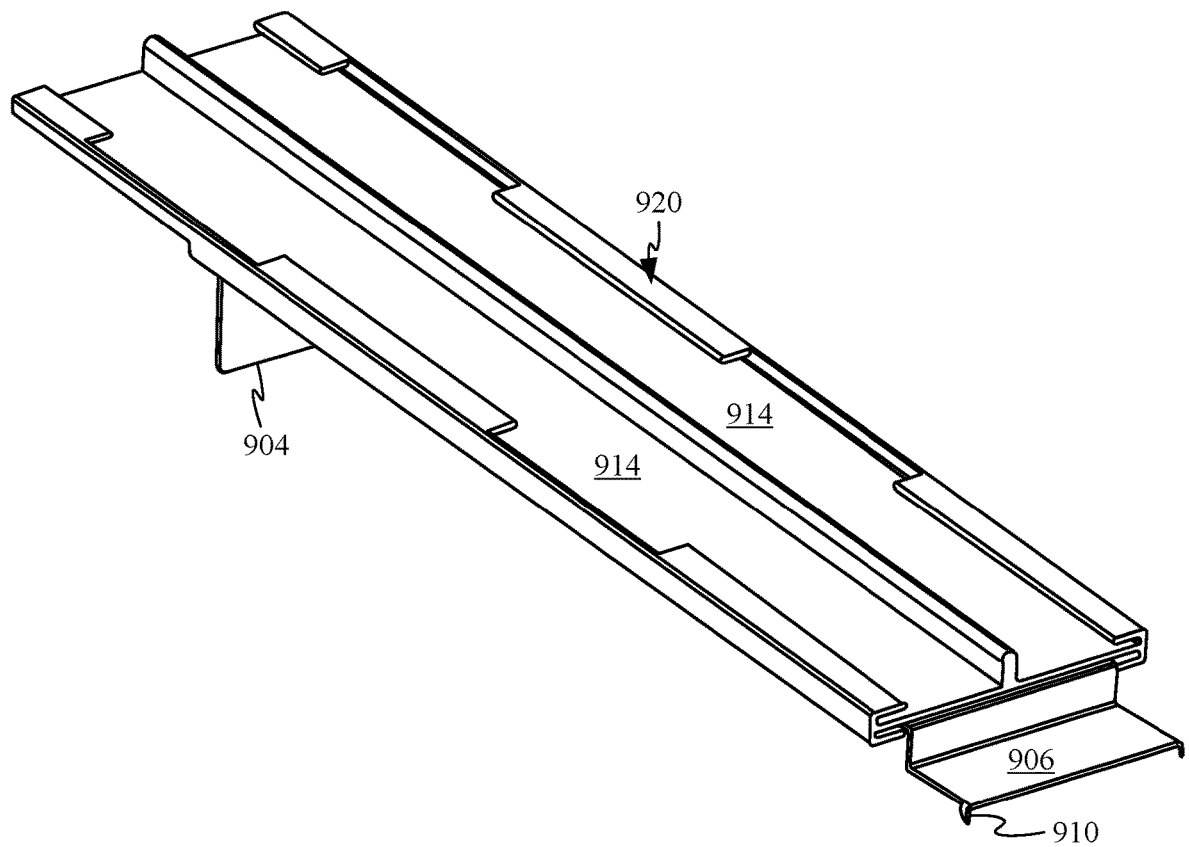
FIG. 9C shows the sidelap embodiment assembled by sliding a base of a base component into an attachment channel of a water drainage component.
Figure 9D:
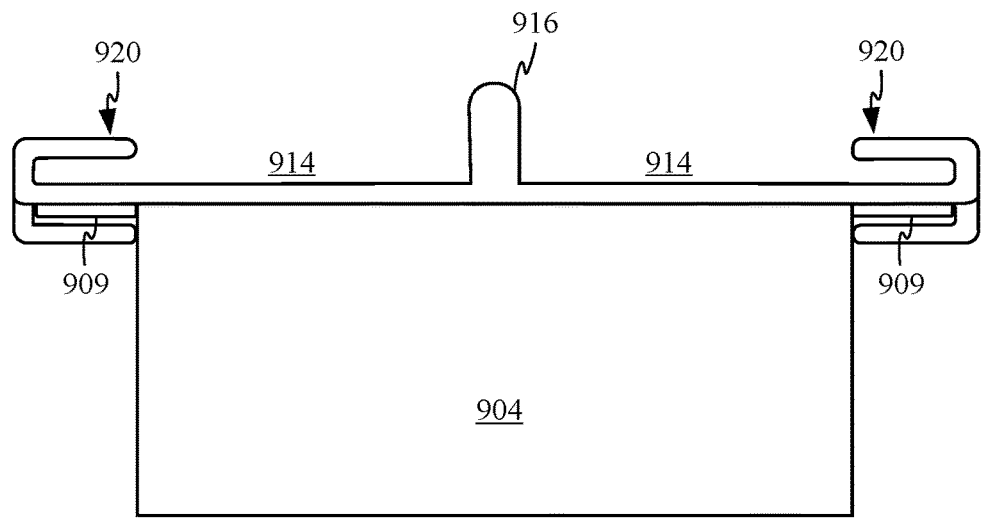
FIG. 9D shows a down-roof end of the sidelap depicted in FIG. 9C.

FIG. 9C shows sidelap 900 assembled by sliding base 908 of base component 902 into attachment channel 922. In some embodiments, base component 902 can be folded into its depicted shape after insertion into channel 922 of water drainage component 912. In some embodiments, standoff 904 and attachment feature 906 can be thick enough to prevent undesired movement of water drainage component 912 relative to base component 908. In some embodiments, base component 902 can shift relative to water drainage component 912. Finally, FIG. 9D shows a down-roof end of sidelap 900. Wings 909 are depicted fully engaged within the undercuts of channel 922. In some embodiments, wings 909 can engage interior surfaces defining channel 922 to create an interference fit between base component 902 and water drainage component 912 that opposes movement of base component 902 relative to water drainage component 912.

Figure 10:
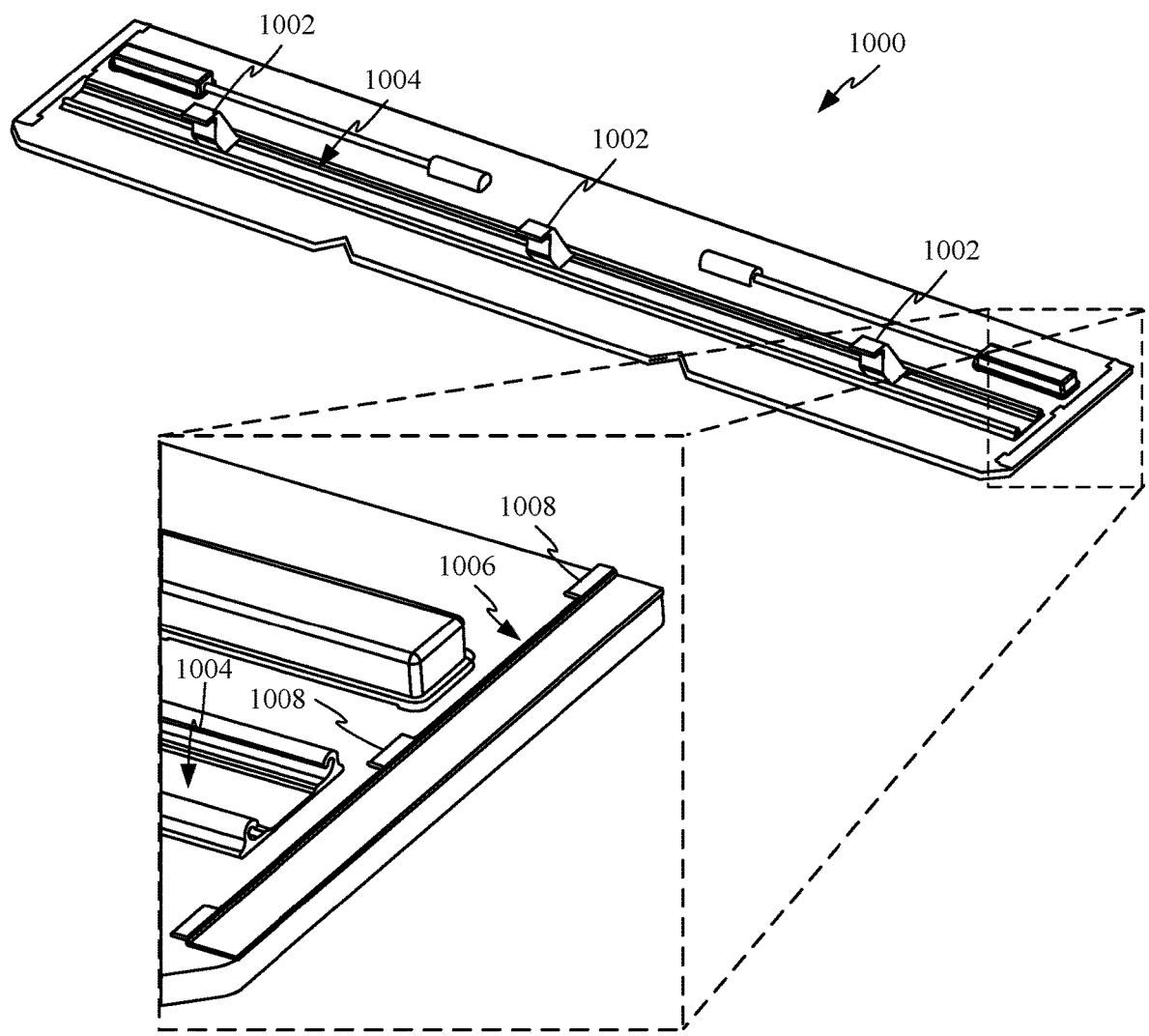
FIG. 10 shows a downward facing surface of a solar roofing module.

FIG. 10 shows a downward facing surface of solar roofing module 1000. Similar to solar roofing module 100, solar roofing module 1000 can include three batten hooks 1002. As depicted, any of batten hooks 1002 can be free to shift laterally across a channel 1004 spanning nearly the whole width of solar roofing module 1000. In some embodiments, each of batten hooks 1002 can have a discrete channel that only spans one of the three regions of solar roofing module 1000. A close up view of a lateral side of solar roofing module 1000 shows how a lateral securing feature 1006 can be adhered or fastened to the underside of a lateral end of solar roofing module 1000. Lateral securing feature 1006 can include multiple tabs 1008 configured to engage tabs 920 of water drainage component 912. This interaction can help prevent the lateral ends of solar roofing module 1000 from being lifted up during high winds or other severe weather systems.

Figure 11:
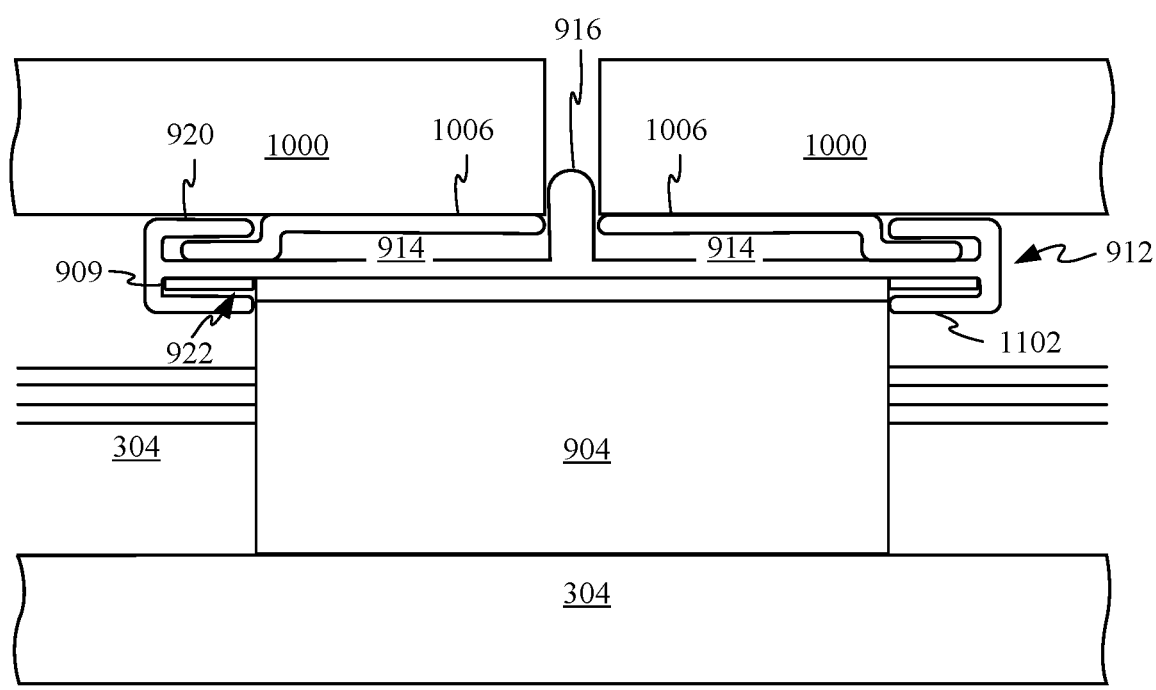
FIG. 11 shows a down-roof end of a sidelap and how a lateral securing feature can engage tabs to secure the lateral ends of solar roofing modules to respective sidelaps.

FIG. 11 shows a down-roof end of sidelap 900 and how lateral securing feature 1006 can engage tabs 920 to secure the lateral ends of solar roofing modules 1000 to sidelap 900. By securing the end of solar roofing module 1000 in this manner the ends of solar roofing modules 1000 can be prevented from pulling up and away from the roofing structure during high winds conditions. FIG. 11 also illustrates how alignment ridge 916 sets the size of the gap between adjacent solar roofing modules 1000. Any water managing to pass between alignment ridge 916 and the lateral edges of solar roofing modules 1000 is routed down-roof by drainage channels 914. FIG. 11 shows how wings 909 are captured and retained within channel 922. In some embodiments, retaining tabs 1102, which form part of the load path for retaining the lateral sides of solar roofing modules 1000, securely anchor water drainage component 912 to base component 902.

Figure 12A:
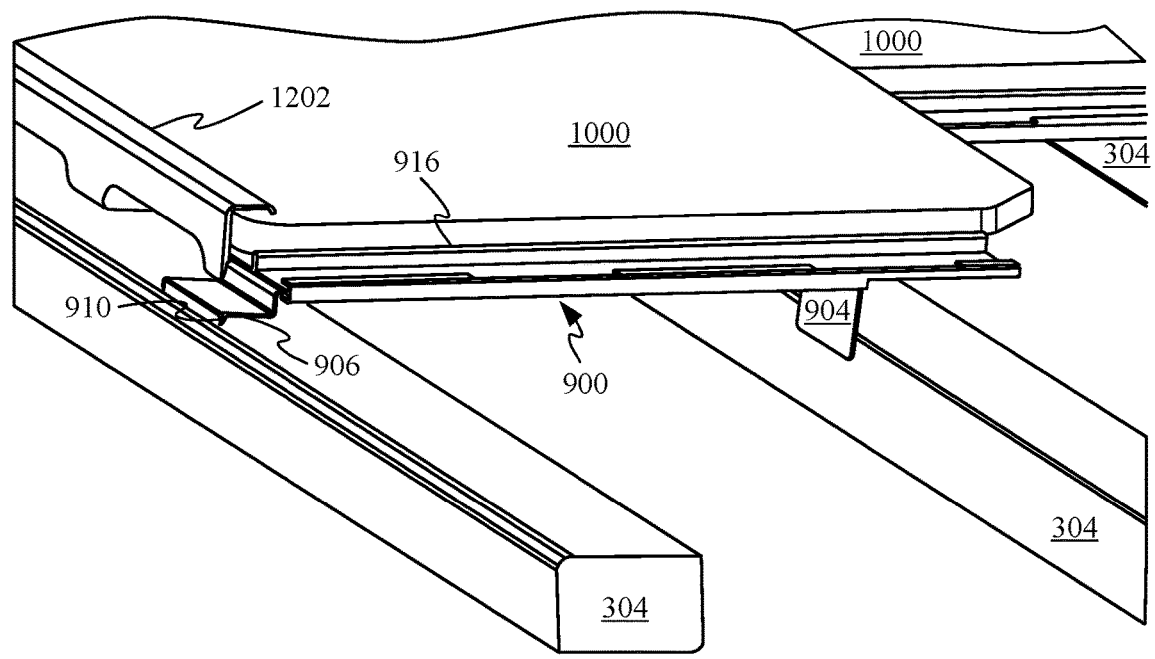
FIGS. 12A-12B show perspective views of solar roofing modules attached to battens arranged across a rooftop.
Figure 12B:
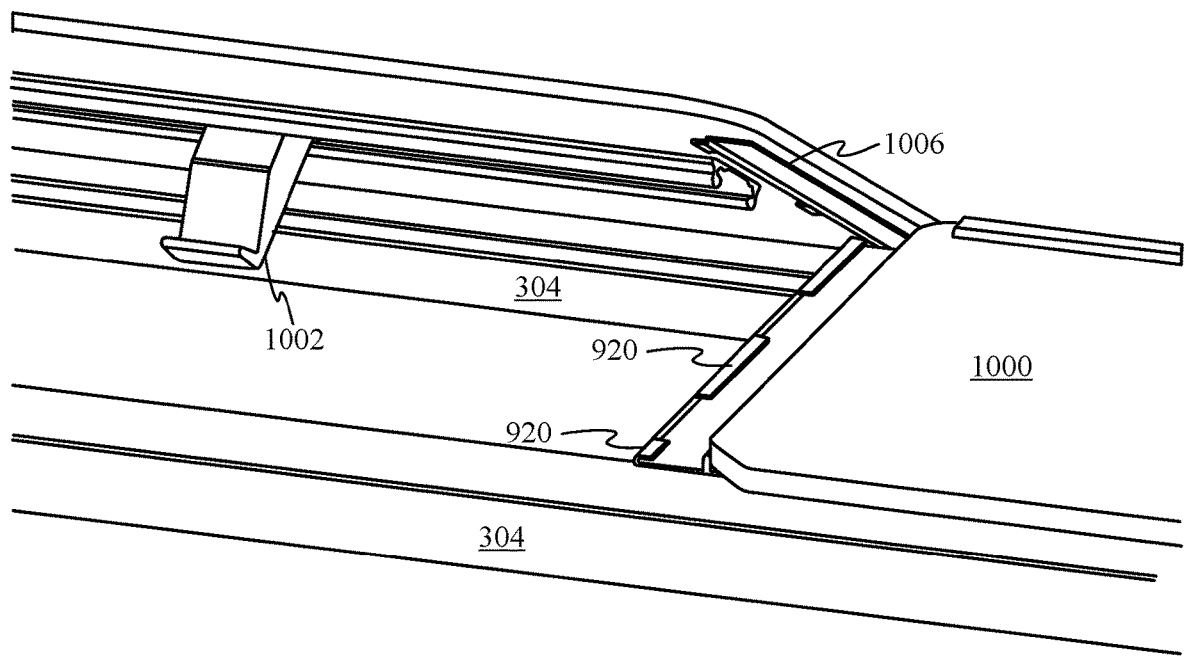

FIGS. 12A-12B show perspective views of solar roofing modules 1000 attached to battens 304. FIG. 12A shows solar roofing module 1000 engaged with one side of sidelap 900. This view better illustrates how alignment ridge 916 limits lateral movement of solar roofing module 1000 once protruding spikes 910 engage batten 304. In some embodiments, a mallet can be applied to attachment feature 906 to drive protruding spikes 910 into batten 304. FIG. 12A also depicts standoff 1202. In addition to helping position the up-roof end of solar roofing module 1000 atop batten 304, standoff 1202 can also prevent direct contact between an up-roof solar roofing module 1000 and a top surface of solar roofing module 1000 or sidelaps 900. FIG. 12A also shows how only a bottom end of standoff 904 contacts a down-roof batten 304. Since batten hooks 1002 support a majority of the down-roof weight applied by solar shingle assemblies 1000, the torque applied to the end of standoff 904 is minimal. Standoff 904 functions primarily to locate attachment feature 906. Assuming a desired interval is properly set between adjacent battens 304, standoff 904 allows for precise vertical positioning of sidelap 900 without any need for measurement or alignment, thereby reducing installation times.

FIG. 12B shows a view of one of solar roofing modules 1000 being rotated up after being slid up-roof to disengage tabs of lateral securing features 1006 from tabs 920 and batten hook 1002 from batten 304. Once these elements are disengaged, solar roofing module 1000 can be rotated up and removed from the roof after any electrical connections are disengaged.

Figure 13:
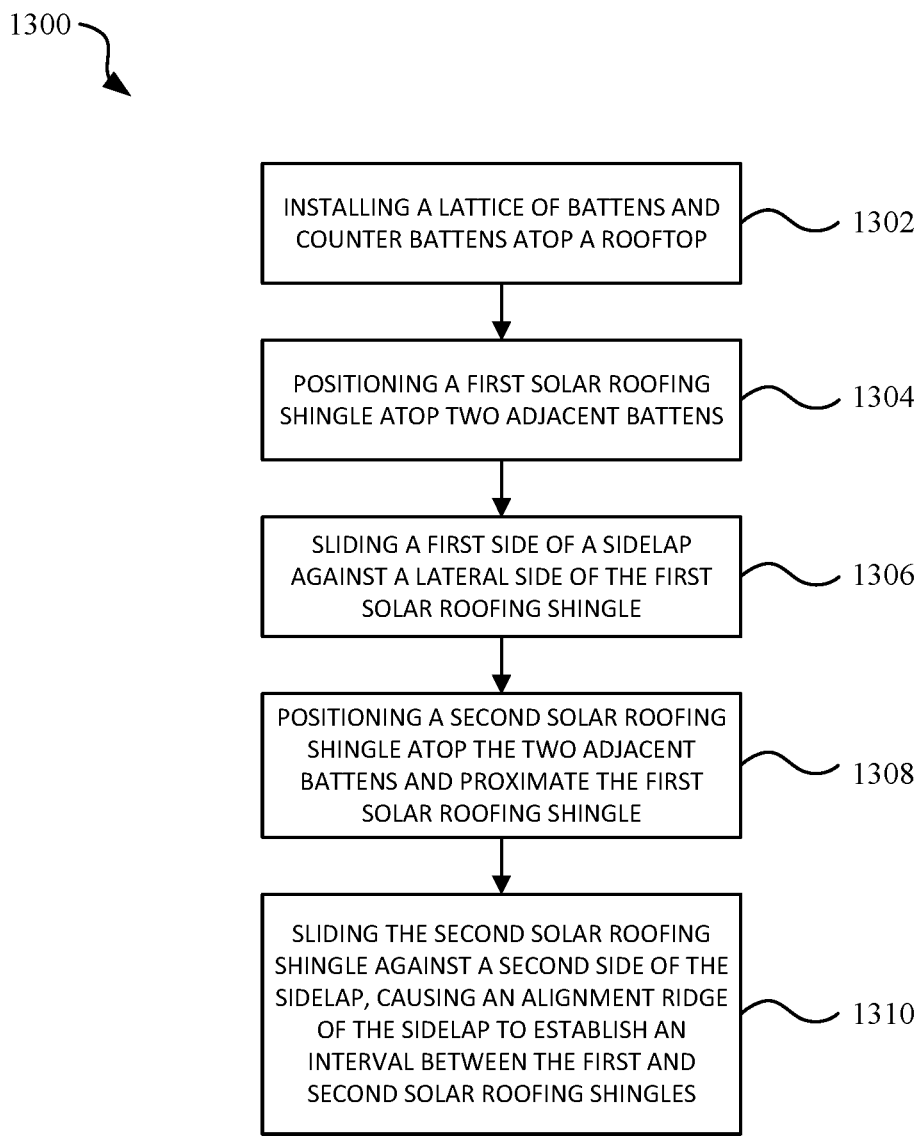
FIG. 13 shows a flow chart illustrating a method for incorporating photovoltaic modules into a roofing structure.

FIG. 13 shows a flow chart illustrating a method for incorporating photovoltaic modules into a roofing structure. At 1302, counter battens are installed in a vertical orientation at a first interval along a rooftop. Battens are then installed atop the counter battens in a horizontal orientation to form a lattice structure. In some embodiments, the battens and counter battens can take the form of wood planks. At 1304, a first solar roofing module can be supported by two adjacent battens. At 1306, a first side of a sidelap can be positioned beneath a lateral side of the first solar roofing module. In some embodiments, placing an alignment ridge of the sidelap into direct contact with a lateral edge of the first solar roofing module results in a drainage channel of the sidelap being positioned beneath the lateral side of the first solar roofing module. At 1308, a second solar roofing module can be positioned atop a second side of the sidelap. The second solar roofing module can then be pressed against an alignment ridge running along the center of the sidelap to help establish a gap between the first and second solar roofing modules and established by the thickness of the alignment ridge.

The various aspects, embodiments, implementations or features of the described embodiments can be used separately or in any combination.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A roofing structure, comprising:
   a first photovoltaic module;
   a second photovoltaic module separated from the first photovoltaic module by a gap; and
   a sidelap comprising a water drainage component disposed beneath the first and second photovoltaic modules and comprising:
      a base supporting a first drainage channel and a second drainage channel; and
      an alignment ridge having a first portion protruding from the base a first distance and a second portion protruding from the base a second distance less than the first distance, wherein the first portion protrudes into the gap and establishes a minimum size of the gap and wherein the alignment ridge separates the first drainage channel from the second drainage channel.

2. The roofing structure as recited in claim 1, wherein a lateral side of the first photovoltaic module overlaps the first drainage channel and a lateral side of the second photovoltaic module overlaps the second drainage channel.

3. The roofing structure as recited in claim 1, wherein the sidelap further comprises a standoff protruding from a side of the sidelap opposite the alignment ridge, wherein the standoff is configured to contact and support the sidelap in a vertical direction against an underlying roof structure.

4. The roofing structure as recited in claim 3, wherein the first and second photovoltaic modules are solar roofing modules, each of the solar roofing modules having the appearance of multiple roofing shingles.

5. The roofing structure as recited in claim 1, wherein the sidelap further comprises water guides disposed at a downroof end of the first and second drainage channels, the water guides being configured to bias the flow of water away from the alignment ridge.

6. The roofing structure as recited in claim 1, wherein a surface of the first portion of the alignment ridge is substantially even with sun-facing surfaces of the first and second photovoltaic modules, and wherein the roofing structure further comprises a third photovoltaic module up-roof of the first and second photovoltaic modules that overlaps the first portion of the alignment ridge.

7. The roofing structure as recited in claim 1, wherein the sidelap further comprises a base component that is separate and distinct from the water drainage component and is coupled to the water drainage component by sliding a base of the base component into a channel defined by the water drainage component.

8. The roofing structure as recited in claim 1, wherein the sidelap comprises:
   an attachment feature protruding from an up-roof end of the sidelap; and
   a standoff protruding from a down-roof end of the sidelap.

9. The roofing structure as recited in claim 8, further comprising:
   a lattice of battens and counter battens,
   wherein the attachment feature is secured to a first batten and the standoff is in contact with a second batten down-roof from the first batten.

10. The roofing structure as recited in claim 9, wherein the first portion of the alignment ridge is positioned at an up-roof end of the alignment ridge and wherein the shorter height of the second portion of the alignment ridge allows the first and second photovoltaic modules to obscure visibility of the second portion of the alignment ridge.

11. A solar roofing structure, comprising:
   a first solar roofing module;
   a second solar roofing module adjacent to the first solar roofing module and separated from the first solar roofing module by a gap; and
   a sidelap comprising:
      a base; and
      an alignment ridge comprising a first portion protruding from the base a first distance and a second portion protruding from the base a second distance less than the first distance, wherein the first portion of the alignment ridge protrudes into the gap to establish a minimum gap between the first and second solar roofing modules.

12. The solar roofing structure as recited in claim 11, wherein the sidelap further comprises an attachment feature disposed at a first end of the sidelap and defining a fastener opening for securing the sidelap to a support structure beneath the first and second solar roofing modules.

13. The solar roofing structure as recited in claim 12, further comprising a wire clip having a bracket sized to slide over the attachment feature.

14. The solar roofing structure as recited in claim 13, wherein the first portion is at an uproof end of the alignment ridge and the second portion is at a downroof end of the alignment ridge, the first distance being substantially greater than the second distance.

15. The solar roofing structure as recited in claim 11, wherein the sidelap defines first and second parallel drainage channels separated by the alignment ridge and positioned at least partially beneath respective first and second solar roofing modules.

16. The solar roofing structure as recited in claim 11, wherein the first solar roofing module has the appearance of multiple roofing shingles separated by gaps having the same width as a width of the alignment ridge.

* * * * *